(12) United States Patent
Lee et al.

(10) Patent No.: US 10,083,959 B2
(45) Date of Patent: Sep. 25, 2018

(54) SEMICONDUCTOR DEVICE STRUCTURE AND METHOD FOR FORMING THE SAME

(71) Applicant: Taiwan Semiconductor Manufacturing Co., Ltd., Hsinchu (TW)

(72) Inventors: Ming-Chang Lee, Hsinchu (TW); Chung-Tsun Sun, Hsinchu (TW); Chia-Der Chang, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 15/687,275

(22) Filed: Aug. 25, 2017

(65) Prior Publication Data

US 2017/0352655 A1     Dec. 7, 2017

Related U.S. Application Data

(63) Continuation of application No. 14/668,519, filed on Mar. 25, 2015, now Pat. No. 9,748,232.

(Continued)

(51) Int. Cl.
| | |
|---|---|
| *H01L 27/088* | (2006.01) |
| *H01L 23/485* | (2006.01) |
| *H01L 27/02* | (2006.01) |
| *H01L 21/768* | (2006.01) |
| *H01L 21/285* | (2006.01) |
| *H01L 21/265* | (2006.01) |

(Continued)

(52) U.S. Cl.
CPC ...... *H01L 27/088* (2013.01); *H01L 21/76895* (2013.01); *H01L 23/485* (2013.01); *H01L 27/0207* (2013.01); *H01L 29/66545* (2013.01); *H01L 29/66636* (2013.01); *H01L 21/26506* (2013.01); *H01L 21/28518* (2013.01); *H01L 21/76831* (2013.01); *H01L 21/76897* (2013.01); *H01L 21/823475* (2013.01); *H01L 29/165* (2013.01); *H01L 29/665* (2013.01); *H01L 29/7848* (2013.01)

(58) Field of Classification Search
CPC ............. H01L 27/088; H01L 21/30604; H01L 29/0642
USPC ........................................................ 257/401
See application file for complete search history.

(56) References Cited

U.S. PATENT DOCUMENTS

| | | |
|---|---|---|
| 5,545,909 A | 8/1996 | Williams et al. |
| 5,701,024 A | 12/1997 | Watt et al. |

(Continued)

FOREIGN PATENT DOCUMENTS

TW     201428889 A     7/2014

*Primary Examiner* — Vu A Vu
(74) *Attorney, Agent, or Firm* — Haynes and Boone, LLP

(57) ABSTRACT

A method includes forming a gate, a first dielectric layer, a first contact structure, and a second contact structure over a substrate. The first contact structure and the second contact structure are over a source region and a drain region respectively. The first dielectric layer surrounds the gate, the first contact structure, and the second contact structure. The method includes forming a second dielectric layer over the first dielectric layer. The second dielectric layer has an opening exposing the gate, the first contact structure, and the second contact structure. A conductive layer is formed in the opening to electrically connect the gate to the first contact structure and the second contact structure.

20 Claims, 34 Drawing Sheets

Related U.S. Application Data

(60) Provisional application No. 62/098,761, filed on Dec. 31, 2014.

(51) Int. Cl.
*H01L 29/66* (2006.01)
*H01L 29/78* (2006.01)
*H01L 29/165* (2006.01)
*H01L 21/8234* (2006.01)

(56) References Cited

U.S. PATENT DOCUMENTS

| | | |
|---|---|---|
| 6,191,461 B1 | 2/2001 | Tsukude et al. |
| 6,309,918 B1 * | 10/2001 | Huang ............ H01L 29/66856 |
| | | 257/E21.451 |
| 6,468,857 B2 * | 10/2002 | Igarashi ............ H01L 21/76895 |
| | | 257/E21.507 |
| 6,767,810 B2 | 7/2004 | Salling et al. |
| 6,995,027 B2 | 2/2006 | Wieczorek et al. |
| 6,998,682 B2 | 2/2006 | Chan et al. |
| 8,021,971 B2 | 9/2011 | Domenicucci et al. |
| 8,188,550 B2 | 5/2012 | Yang et al. |
| 8,253,167 B2 | 8/2012 | Lin et al. |
| 8,293,642 B2 | 10/2012 | Kim et al. |
| 8,513,723 B2 * | 8/2013 | Booth, Jr. ............ H01L 21/845 |
| | | 257/306 |
| 9,012,277 B2 | 4/2015 | Flachowsky et al. |
| 9,024,369 B2 | 5/2015 | JangJian et al. |
| 9,548,238 B2 | 1/2017 | Cheng et al. |
| 2008/0116496 A1 | 5/2008 | Tzeng et al. |
| 2012/0056245 A1 * | 3/2012 | Kang ................ H01L 21/0245 |
| | | 257/192 |
| 2012/0326235 A1 * | 12/2012 | Otsuru ................ H01L 27/0277 |
| | | 257/355 |
| 2013/0146953 A1 * | 6/2013 | Cheng .................... H01L 21/84 |
| | | 257/296 |

\* cited by examiner

SEMICONDUCTOR DEVICE STRUCTURE AND METHOD FOR FORMING THE SAME

CROSS REFERENCE TO RELATED APPLICATIONS

The present application is a Continuation Application of U.S. patent application Ser. No. 14/668,519, filed Mar. 25, 2015, issuing as U.S. Pat. No. 9,748,232, which claims priority to U.S. Provisional Application No. 62/098,761, filed on Dec. 31, 2014, the entirety of each of which is incorporated by reference herein.

BACKGROUND

The semiconductor integrated circuit (IC) industry has experienced rapid growth. Technological advances in IC materials and design have produced generations of ICs. Each generation has smaller and more complex circuits than the previous generation. However, these advances have increased the complexity of processing and manufacturing ICs.

In the course of IC evolution, functional density (i.e., the number of interconnected devices per chip area) has generally increased while geometric size (i.e., the smallest component (or line) that can be created using a fabrication process) has decreased. This scaling-down process generally provides benefits by increasing production efficiency and lowering associated costs.

However, since feature sizes continue to decrease, fabrication processes continue to become more difficult to perform. Therefore, it is a challenge to form reliable semiconductor devices at smaller and smaller sizes.

BRIEF DESCRIPTION OF THE DRAWINGS

Aspects of the present disclosure are best understood from the following detailed description when read with the accompanying figures. It should be noted that, in accordance with standard practice in the industry, various features are not drawn to scale. In fact, the dimensions of the various features may be arbitrarily increased or reduced for clarity of discussion.

FIGS. 2A-2 to 2E-2 are top views of various stages of the process for forming a semiconductor device structure, in accordance with some embodiments.

DETAILED DESCRIPTION

Figure 1A:
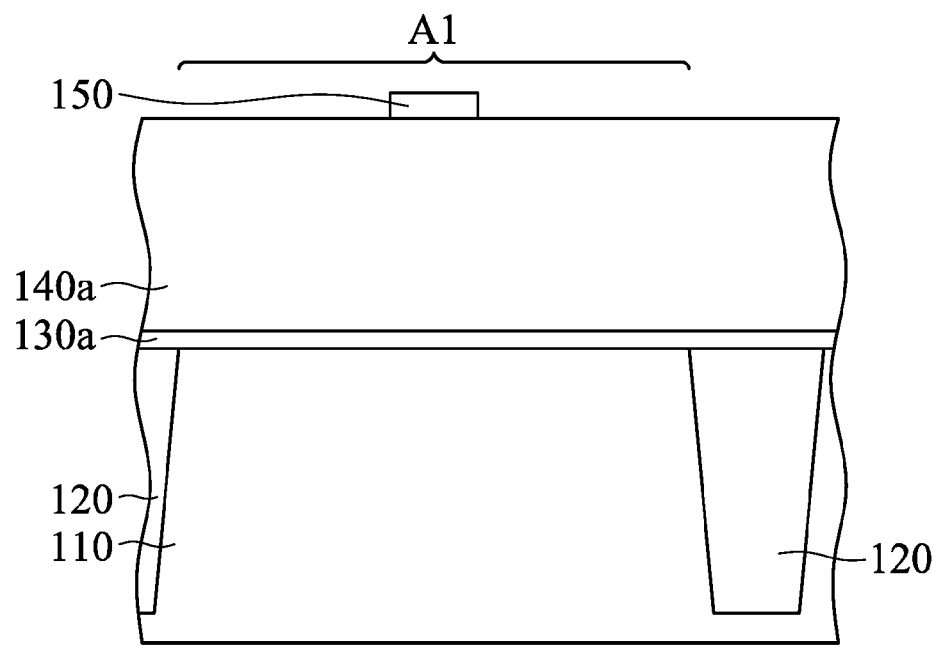
FIGS. 1A-1O are cross-sectional views of various stages of a process for forming a semiconductor device structure, in accordance with some embodiments.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. It should be understood that additional operations can be provided before, during, and after the method, and some of the operations described can be replaced or eliminated for other embodiments of the method.

Figure 1B:
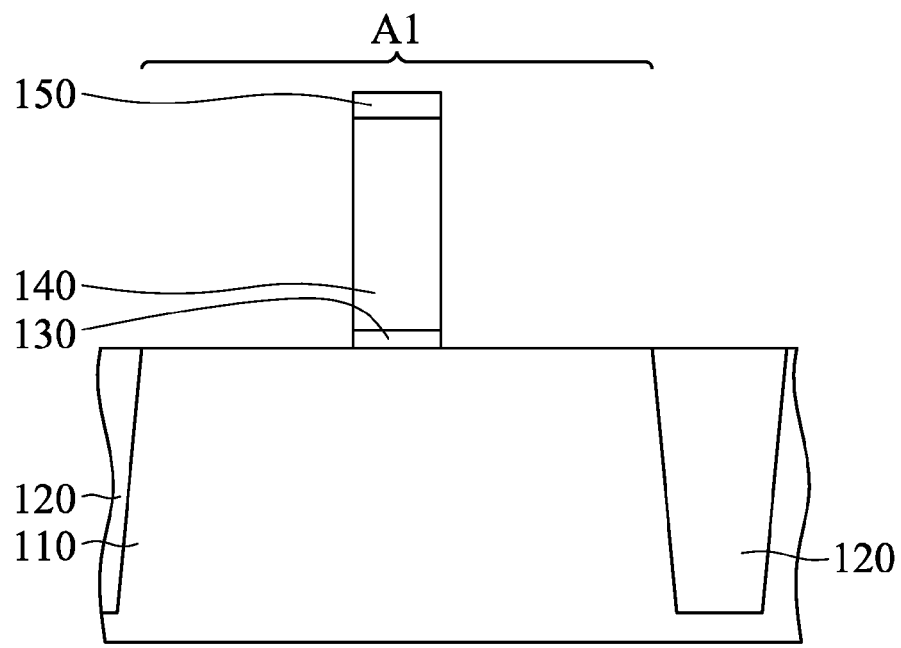
FIGS. 2A-1 to 2E-1 are cross-sectional views of various stages of a process for forming a semiconductor device structure, in accordance with some embodiments.
Figure 1C:
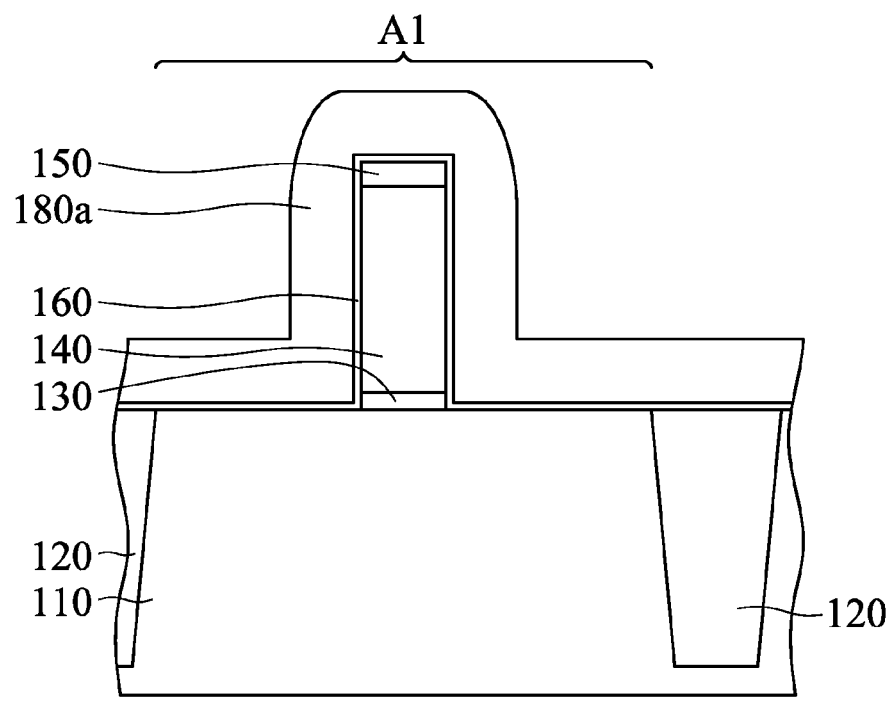
Figure 1D:
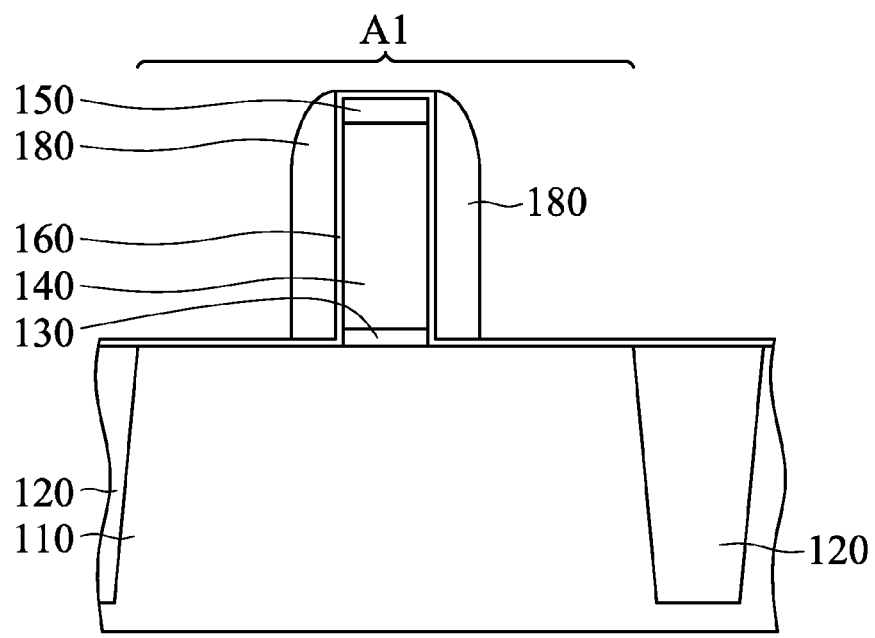
Figure 1E:
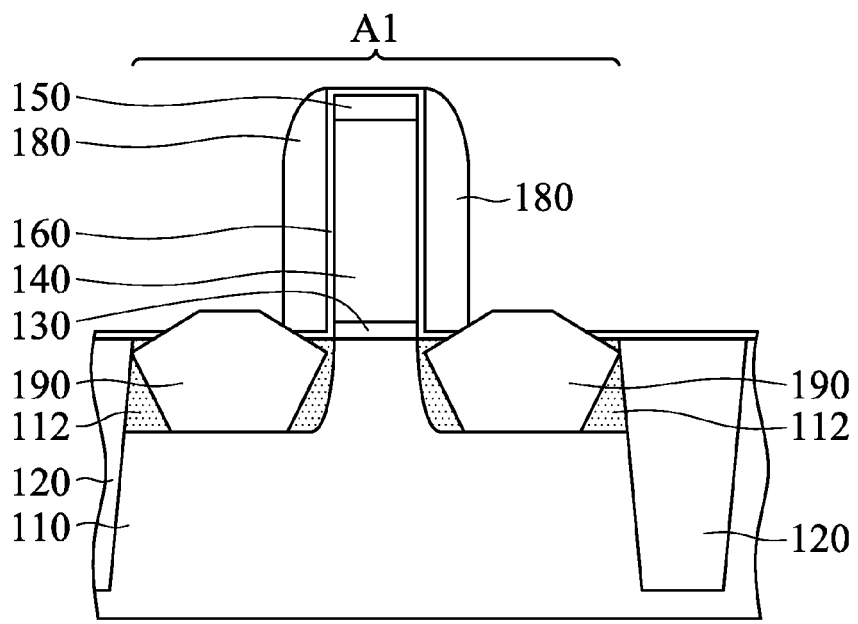
Figure 1F:
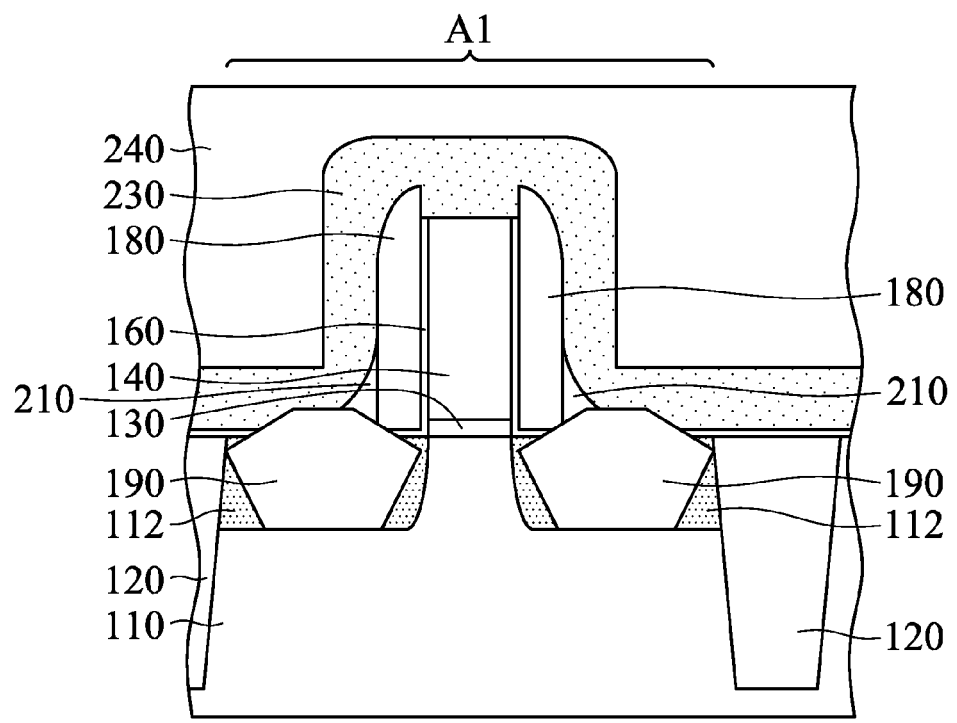
Figure 1G:
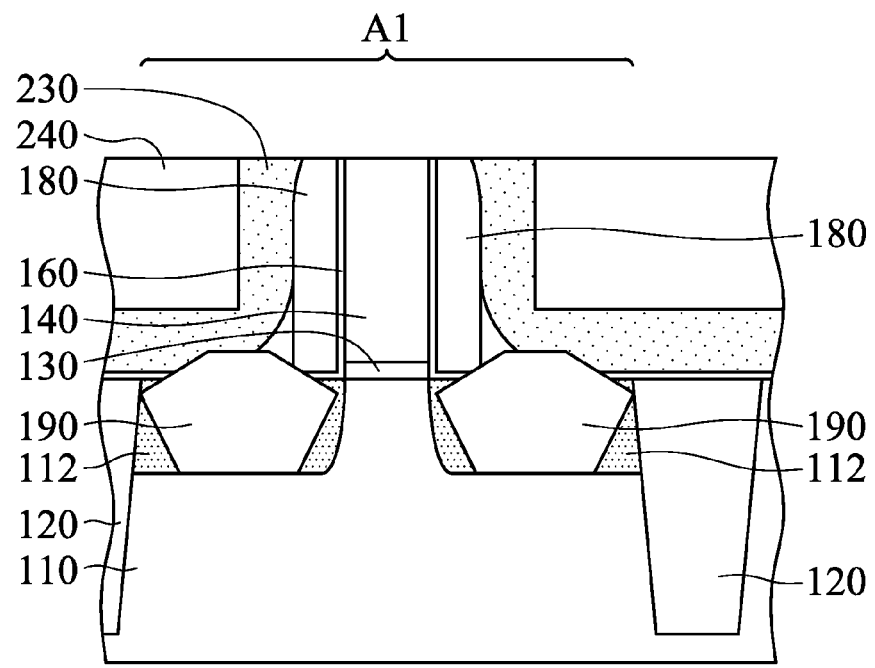
Figure 1H:
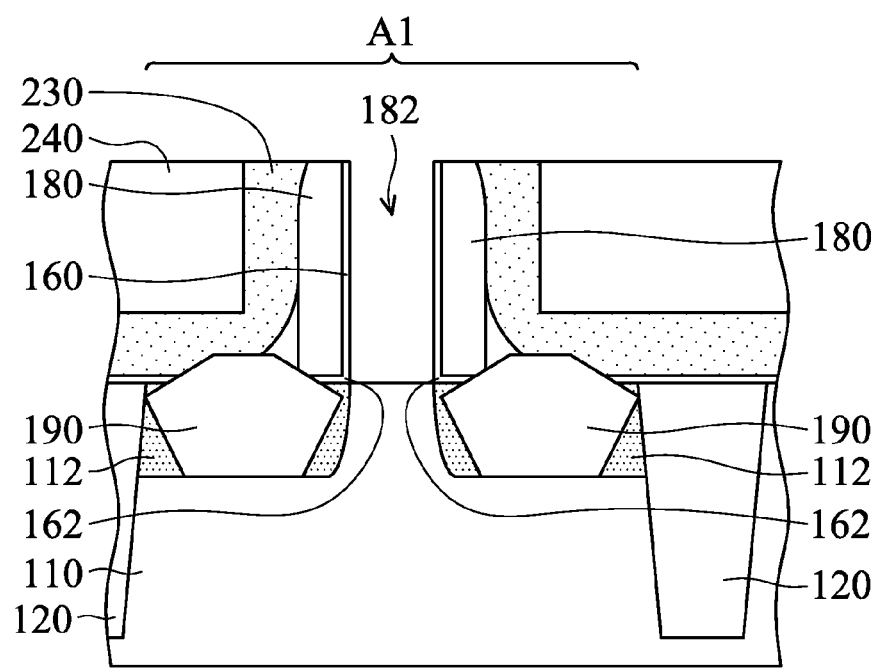
Figure 1I:
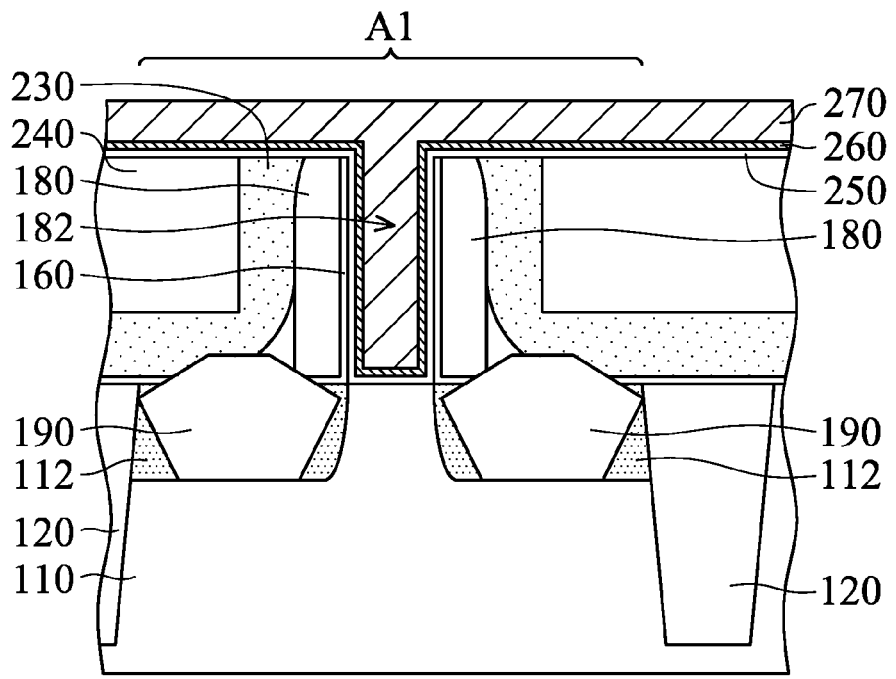
Figure 1J:
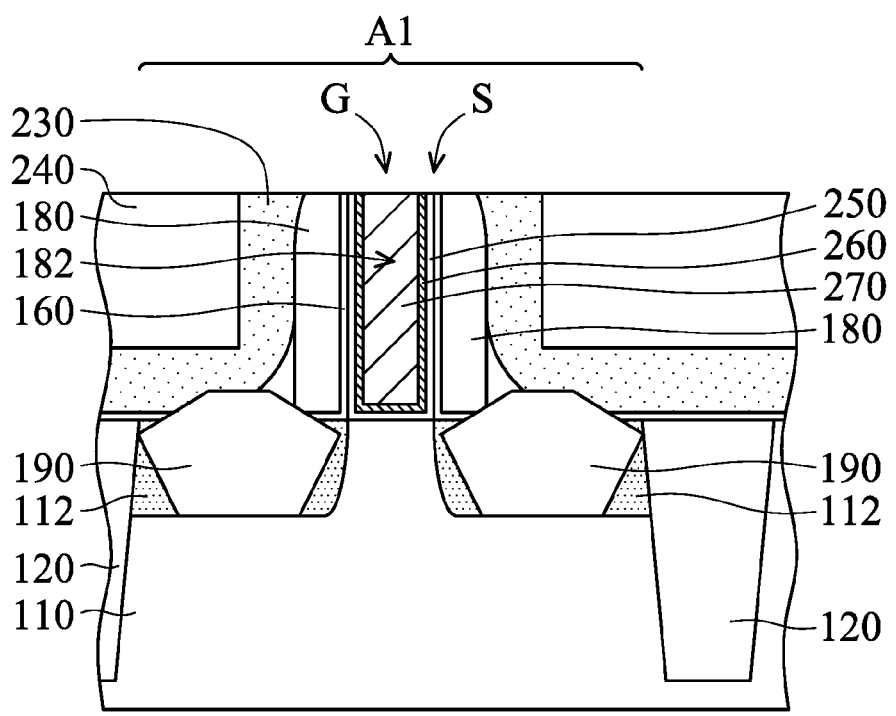
Figure 1K:
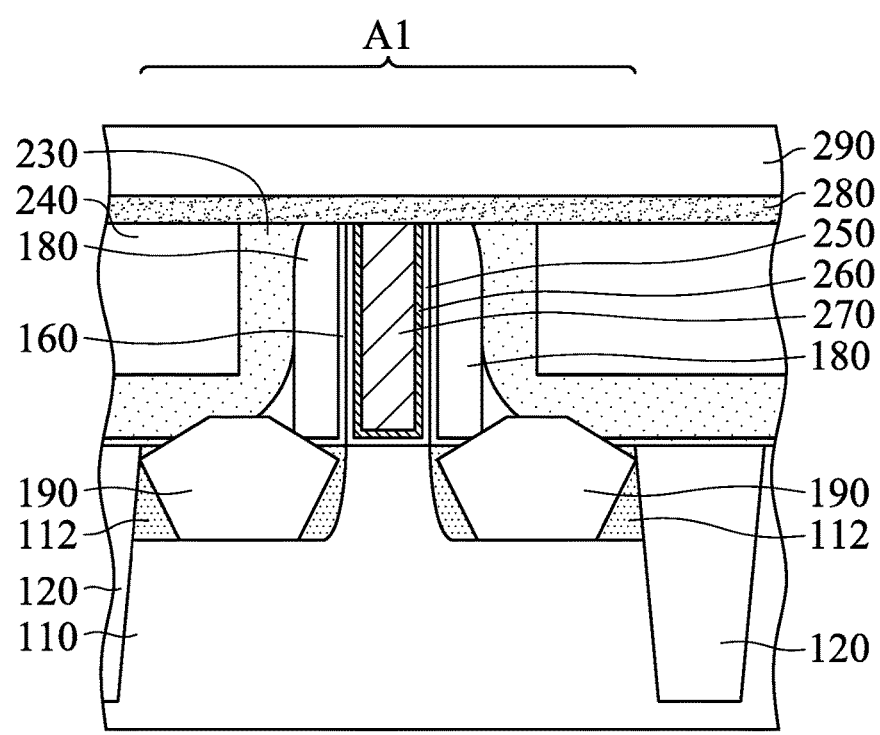
Figure 1L:
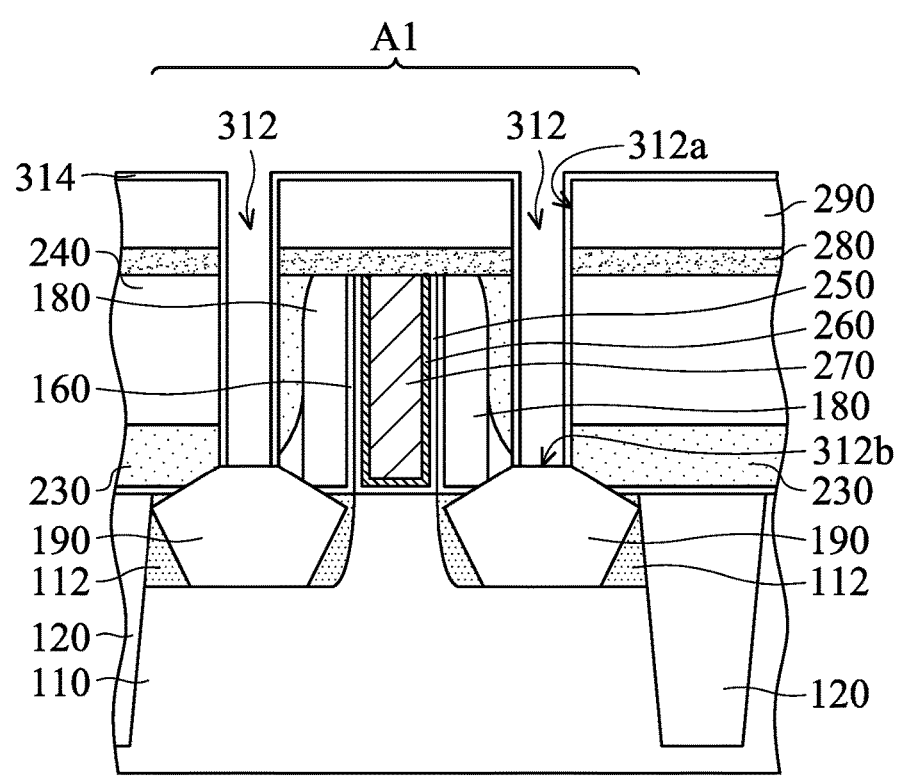
Figure 1M:
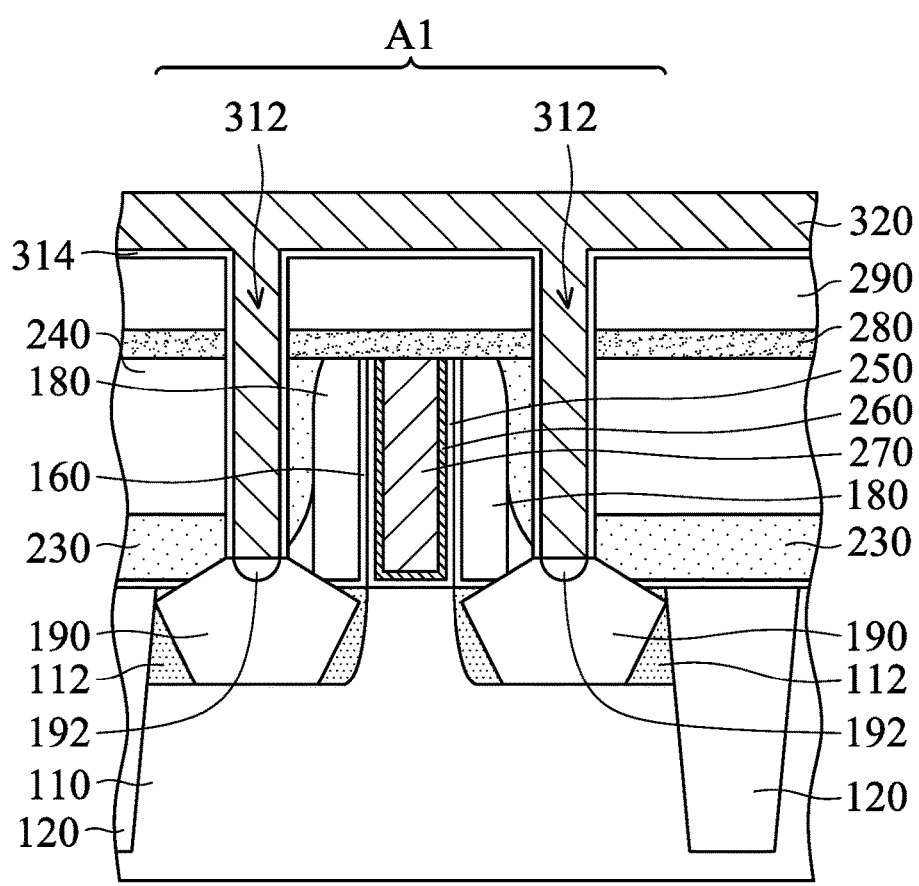
Figure 1N:
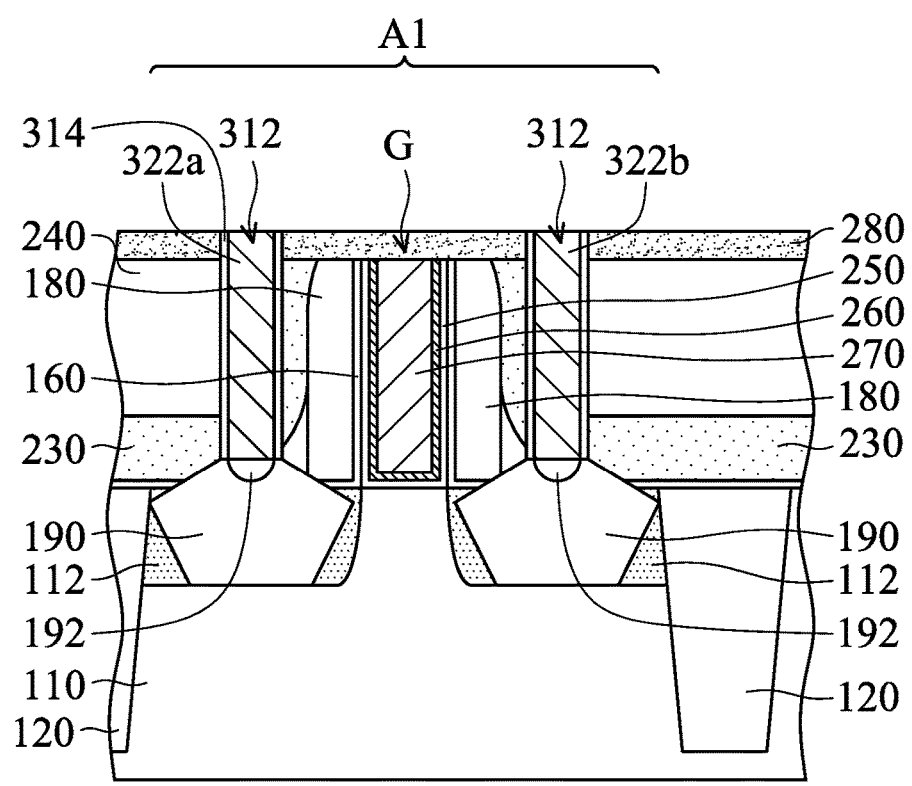
Figure 1O:
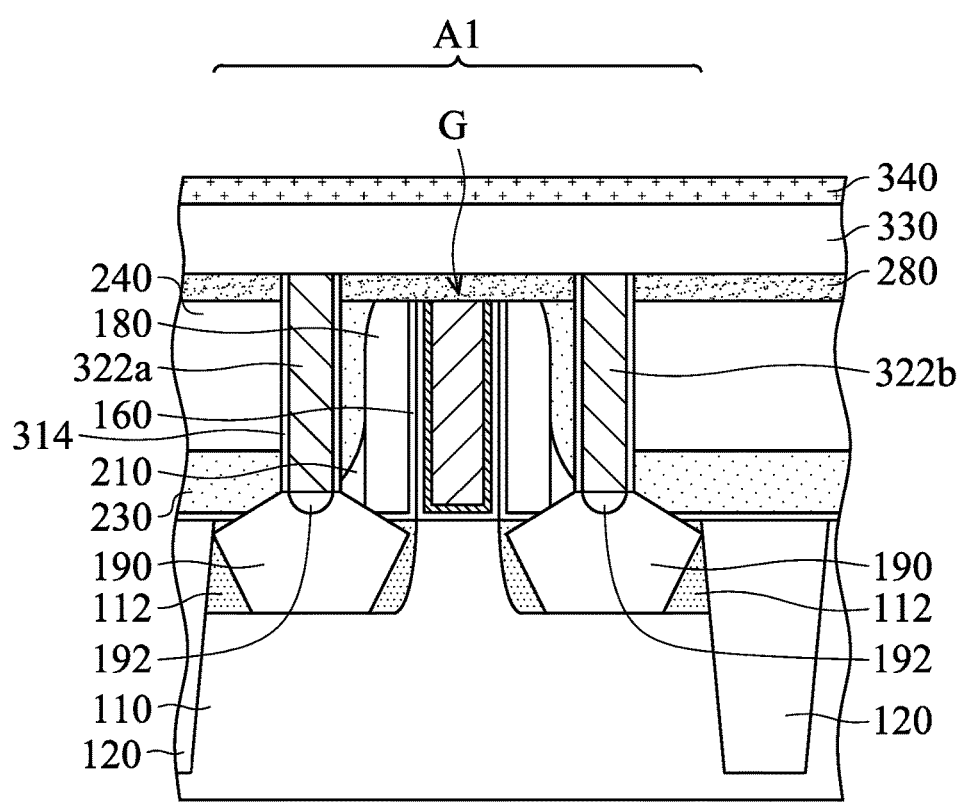

FIGS. 1A-1O are cross-sectional views of various stages of a process for forming a semiconductor device structure, in accordance with some embodiments. As shown in FIG. 1A, a semiconductor substrate 110 is provided. The semiconductor substrate 110 includes a semiconductor wafer (such as a silicon wafer) or a portion of a semiconductor wafer.

In some embodiments, the semiconductor substrate 110 is made of an elementary semiconductor material including silicon or germanium in a single crystal, polycrystal, or amorphous structure. In some other embodiments, the semiconductor substrate 110 is made of a compound semiconductor such as silicon carbide, gallium arsenide, gallium phosphide, indium phosphide, indium arsenide, an alloy semiconductor such as SiGe, or GaAsP, or a combination thereof. In some embodiments, the semiconductor substrate 110 includes multi-layer semiconductors, semiconductor-on-insulator (SOI) (such as silicon-on-insulator or germanium-on-insulator), or a combination thereof.

As shown in FIG. 1A, an isolation structure 120 is formed in the semiconductor substrate 110, in accordance with some embodiments. The isolation structure 120 surrounds an active region A1 of the semiconductor substrate 110, in accordance with some embodiments. The isolation structure 120 is configured to define and electrically isolate various device elements (not shown) formed in the semiconductor substrate 110, in accordance with some embodiments.

Examples of the various device elements include transistors (e.g., metal oxide semiconductor field effect transistors (MOSFET), complementary metal oxide semiconductor (CMOS) transistors, bipolar junction transistors (BJT), high-voltage transistors, high-frequency transistors, p-channel and/or n-channel field effect transistors (PFETs/NFETs), etc.), diodes, another suitable element, or a combination thereof. Various processes are performed to form the various device elements, such as deposition, etching, implantation, photolithography, annealing, planarization, another applicable process, or a combination thereof.

The isolation structure 120 is made of a dielectric material, in accordance with some embodiments. The dielectric material includes silicon oxide, silicon nitride, silicon oxynitride, fluoride-doped silicate glass (FSG), a low-K dielectric material, other suitable materials, or a combination thereof, in accordance with some embodiments. The isolation structure 120 is formed by using an isolation technology, such as local oxidation of semiconductor (LOCOS), shallow trench isolation (STI), or the like, in accordance with some embodiments.

In some embodiments, the formation of the isolation structure 120 includes patterning the semiconductor substrate 110 by performing a photolithography process and an etching process to the semiconductor substrate 110 so as to form a trench in the semiconductor substrate 110; and filling the trench with the dielectric material.

The etching process for forming the trench includes a dry etching process, a wet etching process, a plasma etching process, or a combination thereof, in accordance with some embodiments. The filling of the trench includes a chemical vapor deposition process, in accordance with some embodiments. In some embodiments, the filled trench has a multi-layer structure, such as a thermal oxide liner layer filled with silicon nitride or silicon oxide.

As shown in FIG. 1A, a gate dielectric material layer 130a is deposited over the semiconductor substrate 110, in accordance with some embodiments. The gate dielectric material layer 130a is made of silicon oxide, in accordance with some embodiments. The gate dielectric material layer 130a is deposited using a chemical vapor deposition process (CVD process), in accordance with some embodiments.

As shown in FIG. 1A, a dummy gate material layer 140a is deposited over the gate dielectric material layer 130a, in accordance with some embodiments. The dummy gate material layer 140a is made of polysilicon, in accordance with some embodiments. The dummy gate material layer 140a is deposited using a chemical vapor deposition process, in accordance with some embodiments.

As shown in FIG. 1A, a mask layer 150 is formed over the dummy gate material layer 140a, in accordance with some embodiments. The mask layer 150 exposes a portion of the dummy gate material layer 140a, in accordance with some embodiments. In some embodiments, the mask layer 150 includes oxide or nitride, such as silicon oxide, silicon oxynitride, silicon nitride, or the like. The mask layer 150 is formed by a depositing process (such as a chemical vapor deposition process), a photolithography process, and an etching process, in accordance with some embodiments.

As shown in FIG. 1B, the dummy gate material layer 140a exposed by the mask layer 150 is removed, and the gate dielectric material layer 130a under the removed dummy gate material layer 140a is also removed, in accordance with some embodiments. The dummy gate material layer 140a remaining under the mask layer 150 forms a dummy gate 140, in accordance with some embodiments. The gate dielectric material layer 130a remaining under the dummy gate 140 forms a gate dielectric layer 130, in accordance with some embodiments. The removal process includes a dry etching process, in accordance with some embodiments.

As shown in FIG. 1C, a protective layer 160 is formed over the semiconductor substrate 110 to cover the mask layer 150, the dummy gate 140, and the gate dielectric layer 130, in accordance with some embodiments. The protective layer 160 is configured to protect subsequently formed spacers from damage during a dummy-gate removal process, in accordance with some embodiments. The protective layer 160 includes oxide, in accordance with some embodiments. The protective layer 160 is formed by an atomic layer deposition (ALD) process, a chemical vapor deposition process, or a physical vapor deposition (PVD) process, in accordance with some embodiments.

As shown in FIG. 1C, a spacer layer 180a is formed over the protective layer 160 to cover the mask layer 150, the dummy gate 140, and the gate dielectric layer 130, in accordance with some embodiments. The spacer layer 180a includes an insulating material, such as silicon oxide or silicon nitride. The spacer layer 180a is formed using a chemical vapor deposition process, in accordance with some embodiments.

As shown in FIGS. 1C and 1D, an anisotropic etching process is performed to remove a portion of the spacer layer 180a, in accordance with some embodiments. The spacer layer 180a remaining over the sidewalls of the mask layer 150, the dummy gate 140, and the gate dielectric layer 130 forms spacers 180, in accordance with some embodiments.

The spacers 180 are configured to electrically isolate a subsequently formed gate from other devices and configured to act as a mask layer in a subsequent ion implantation process, in accordance with some embodiments. The anisotropic etching process includes a dry etching process, in accordance with some embodiments.

As shown in FIG. 1E, heavily doped regions 112 are formed in the semiconductor substrate 110, in accordance with some embodiments. The heavily doped regions 112 are formed using an ion implantation process, in accordance with some embodiments. The ion implantation process is performed to introduce p-type impurities (e.g., boron) or n-type impurities (e.g., phosphorus) into the semiconductor substrate 110, in accordance with some embodiments.

The heavily doped regions 112 are a heavily doped source region and a heavily doped drain region, in accordance with some embodiments. The heavily doped regions 112 are located at the two opposite sides of the dummy gate 140, in accordance with some embodiments.

As shown in FIG. 1E, stressors 190 are formed in the heavily doped regions 112 by using suitable processes, in accordance with some embodiments. The suitable processes include, for example, an etching process for removing a portion of the semiconductor substrate 110 and a selective epitaxial growth (SEG) process. Depending on the desired type of the resulting MOS device, either stressors applying a compressive stress to the channel region (such as SiGe stressors) or stressors applying a tensile stress to the channel region (such as SiC stressors) are formed.

As shown in FIGS. 1E and 1F, the mask layer 150 and the protective layer 160 over the mask layer 150 are removed, in accordance with some embodiments. The removal process includes a dry etching process, in accordance with some embodiments. As shown in FIG. 1F, spacer oxide layers 210 may be formed over the spacers 180 and the stressors 190 by using, for example, a chemical vapor deposition process. The spacer oxide layers 210 may fill the gaps between the spacers 180 and the stressors 190 to facilitate films, which are subsequently formed, to cover the spacers 180 and the stressors 190 smoothly. However, in some other embodiments, the spacer oxide layers 210 are not formed.

As shown in FIG. 1F, a contact etch stop layer 230 is formed over the semiconductor substrate 110 to cover the stressors 190, in accordance with some embodiments. The contact etch stop layer 230 includes a dielectric material, in accordance with some embodiments. The contact etch stop layer 230 includes silicon nitride, in accordance with some embodiments. The contact etch stop layer 230 is formed over the stressors 190, the spacers 180, the dummy gate 140, and the semiconductor substrate 110, in accordance with some embodiments. In some other embodiments, the contact etch stop layer 230 is not formed.

As shown in FIG. 1F, an insulating layer 240 is deposited over the contact etch stop layer 230, in accordance with some embodiments. The insulating layer 240 includes silicon oxide, silicon oxynitride, borosilicate glass (BSG), phosphoric silicate glass (PSG), borophosphosilicate glass (BPSG), fluorinated silicate glass (FSG), low-k material, porous dielectric material, or a combination thereof, in accordance with some embodiments. The insulating layer 240 is deposited using a CVD process, a HDPCVD process, a spin-on process, a sputtering process, or a combination thereof, in accordance with some embodiments.

Afterwards, as shown in FIG. 1G, a planarization process is performed on the insulating layer 240 until a top surface of the dummy gate 140 is exposed, in accordance with some embodiments. The planarization process includes a chemical mechanical polishing (CMP) process, in accordance with some embodiments. After the planarization process is performed, the insulating layer 240 has a substantially planar surface to facilitate subsequent process steps.

As shown in FIG. 1H, the dummy gate 140 is removed, in accordance with some embodiments. The removal process for removing the dummy gate 140 includes a wet etching process, a dry etching process, or a combination thereof, in accordance with some embodiments. In some embodiments, the gate dielectric layer 130 is also removed. After the dummy gate 140 and the gate dielectric layer 130 are removed, an opening 182 is formed between the spacers 180. The opening 182 is a trench, in accordance with some embodiments.

As shown in FIG. 1I, a gate dielectric layer 250 is formed to cover a bottom of the opening 182, in accordance with some embodiments. The gate dielectric layer 250 further covers the inner walls of the opening 182 and top surfaces of the protective layer 160, the spacers 180, the contact etch stop layer 230, and the insulating layer 240, in accordance with some embodiments.

The gate dielectric layer 250 includes a dielectric material, such as a high dielectric constant (high-k) material. The high-k material includes hafnium oxide (HfO$_2$), hafnium silicon oxide (HfSiO), hafnium silicon oxynitride (HfSiON), hafnium tantalum oxide (HfTaO), hafnium titanium oxide (HfTiO), hafnium zirconium oxide (HfZrO), other suitable high-k dielectric materials, or a combination thereof.

The high-k material is made of metal oxides, metal nitrides, metal silicates, transition metal-oxides, transition metal-nitrides, transition metal-silicates, oxynitrides of metals, aluminum oxide, hafnium dioxide-alumina (HfO$_2$—Al$_2$O$_3$) alloy, other suitable materials, or a combination thereof, in accordance with some embodiments.

The gate dielectric layer 250 is deposited by any suitable process, such as atomic layer deposition (ALD), chemical vapor deposition (CVD), physical vapor deposition (PVD), sputtering, plating, other suitable processes, or a combination thereof, in accordance with some embodiments. In some embodiments, the gate dielectric layer 250 needs to be annealed.

An intermediate dielectric layer (not shown) may be formed over the semiconductor substrate 110 before the gate dielectric layer 250 is formed. The intermediate dielectric layer includes a suitable dielectric material, such as silicon oxide, hafnium silicate, silicon oxynitride, or a combination thereof.

As shown in FIG. 1I, a work function metal layer 260 is deposited over the gate dielectric layer 250, in accordance with some embodiments. The work function metal layer 260 provides a desired work function for transistors to enhance device performance including improved threshold voltage.

In the embodiments of forming a PMOS transistor, the work function metal layer 260 can be a p-type metal capable of providing a work function value suitable for the device, such as equal to or greater than about 4.8 eV. The p-type metal includes metal, metal carbide, metal nitride, other suitable materials, or a combination thereof, in accordance with some embodiments. For example, the p-type metal is made of titanium, titanium nitride, other suitable materials, or a combination thereof.

On the other hand, in the embodiments of forming an NMOS transistor, the work function metal layer 260 can be an n-type metal capable of providing a work function value suitable for the device, such as equal to or less than about 4.5 eV. The n-type metal includes metal, metal carbide, metal nitride, or a combination thereof, in accordance with some embodiments. For example, the n-type metal is made of tantalum, tantalum nitride, or a combination thereof.

The work function metal layer 260 is made of hafnium, zirconium, titanium, tantalum, aluminum, metal carbide (e.g., hafnium carbide, or zirconium carbide), aluminide, ruthenium or a combination thereof, in accordance with some embodiments. The work function metal layer 260 is deposited using a PVD process, CVD process, ALD process, plating process, another suitable method, or a combination thereof, in accordance with some embodiments.

As shown in FIG. 1I, a gate electrode layer 270 (also called a metal gate electrode layer) is deposited over the work function metal layer 260 to fill the opening 182, in accordance with some embodiments. The gate electrode layer 270 includes a suitable metal material, such as aluminum, tungsten, gold, platinum, cobalt, another suitable metal, an alloy thereof, or a combination thereof, in accordance with some embodiments. The gate electrode layer 270 is deposited using a PVD process, a CVD process, a plating process, the like, or a combination thereof, in accordance with some embodiments.

Afterwards, as shown in FIG. 1J, a planarization process is performed to remove the gate electrode layer 270, the work function metal layer 260, and the gate dielectric layer 250 outside of the opening 182, in accordance with some embodiments. The planarization process includes a chemical mechanical polishing (CMP) process or the like, in accordance with some embodiments. The gate electrode layer 270 and the work function metal layer 260 together form a gate G (i.e., a metal gate), which is surrounded by the insulating layer 240. In some embodiments, a gate stack structure S includes the gate G, the gate dielectric layer 250, the protective layer 160, the spacers 180, the spacer oxide layers 210.

As shown in FIG. 1K, an etch stop layer 280 (also called an insulating layer or a dielectric layer) is deposited over the top surfaces of the insulating layer 240, the contact etch stop layer 230, the spacers 180, the protective layer 160, the work function metal layer 260, and the gate electrode layer 270, in accordance with some embodiments. The etch stop layer 280 is made of silicon nitride, in accordance with some embodiments.

As shown in FIG. 1K, a protective layer 290 is formed on the etch stop layer 280, in accordance with some embodiments. The protective layer 290 is configured to protect the etch stop layer 280 from damage during a subsequent pre-amorphized implantation (PAI) process, in accordance with some embodiments. The protective layer 290 includes a plasma-enhanced oxide (PEOX) layer, in accordance with some embodiments.

As shown in FIG. 1L, portions of the protective layer 290, the etch stop layer 280, the insulating layer 240, and the contact etch stop layer 230 are removed to form contact openings 312 passing through the protective layer 290, the etch stop layer 280, the insulating layer 240, and the contact etch stop layer 230, in accordance with some embodiments. The contact openings 312 expose the stressors 190, in accordance with some embodiments. The removal process includes performing a photolithography process and an etching process, in accordance with some embodiments. The etching process includes a dry etching process, in accordance with some embodiments. The dry etching process includes a plasma etching process, in accordance with some embodiments.

As shown in FIG. 1L, a dielectric spacer liner (DSL) layer 314 is conformally formed on the protective layer 290 and the sidewalls 312a of the contact openings 312, in accordance with some embodiments. The DSL layer 314 is configured to protect the sidewalls 312a from being damaged by the subsequent PAI process. The DSL layer 314 is made of, for example, SiOC or other suitable materials.

A pre-amorphized implantation (PAI) process is performed to reduce the dopant channeling effect and enhance dopant activation, in accordance with some embodiments. In some embodiments, silicon, germanium or carbon is used. In some other embodiments, inert gases, such as neon, argon, krypton, xenon, and/or radon, are used.

The PAI process prevents subsequently doped impurities from channeling through spaces within the crystal lattice structure and reaching deeper than the desired depths. Portions of the stressors 190 exposed and located at the bottoms 312b of the openings 312 are turned into an amorphous state as a result of the PAI process.

As shown in FIG. 1M, a salicidation (self-aligned silicidation) process is performed to form metal silicide regions 192 on/in the stressors 190, in accordance with some embodiments. The material of the metal silicide regions 192 is made of nickel silicide, in accordance with some embodiments.

In some embodiments, the metal silicide regions 192 are made of a silicide material of a suitable metal material. The suitable metal material includes cobalt (Co), platinum (Pt), titanium (Ti), ytterbium (Yb), molybdenum (Mo), erbium (Er), or a combination thereof, in accordance with some embodiments. In some embodiments, the salicidation process is not performed.

As shown in FIG. 1M, a conductive layer 320 is deposited on the protective layer 290 and is filled into the openings 312 to electrically contact the metal silicide regions 192, in accordance with some embodiments. The conductive layer 320 is formed by, for example, a PVD process or other suitable processes. The conductive layer 320 is made of, for example, tungsten or other suitable conductive materials.

As shown in FIG. 1N, a planarization process is performed to remove the conductive layer 320 and the DSL layer 314 outside the openings 312, and the protective layer 290, in accordance with some embodiments. The planarization process includes a chemical mechanical polishing (CMP) process, in accordance with some embodiments.

After the CMP process, the conductive layer 320 remaining in the openings 312 forms contact structures 322a and 322b, in accordance with some embodiments. The contact structures 322a and 322b are also referred to as conductive contact plugs, in accordance with some embodiments. The contact structures 322a and 322b are electrically connected to the metal silicide regions 192 thereunder and the corresponding heavily doped regions 112 (i.e. the S/D regions). After the CMP process, top surfaces of the contact structures 322a and 322b, the DSL layer 314, and the etch stop layer 280 are coplanar with each other, in accordance with some embodiments.

As shown in FIG. 1O, a dielectric layer 330 is deposited over the etch stop layer 280, the contact structures 322a and 322b, and the DSL layer 314, in accordance with some embodiments. The dielectric layer 330 without being pattered is also referred to as a dielectric material layer, in accordance with some embodiments.

The dielectric layer 330 includes silicon oxide, silicon oxynitride, borosilicate glass (BSG), phosphoric silicate glass (PSG), borophosphosilicate glass (BPSG), fluorinated silicate glass (FSG), low-k material, porous dielectric material, or a combination thereof, in accordance with some embodiments. The dielectric layer 330 is deposited using a CVD process, a HDPCVD process, a spin-on process, a sputtering process, or a combination thereof, in accordance with some embodiments.

As shown in FIG. 1O, an etch stop layer 340 is deposited over the dielectric layer 330, in accordance with some embodiments. The etch stop layer 340 includes a dielectric material, in accordance with some embodiments. The etch stop layer 340 includes oxide or nitride, in accordance with some embodiments.

Figures 1, 2A:
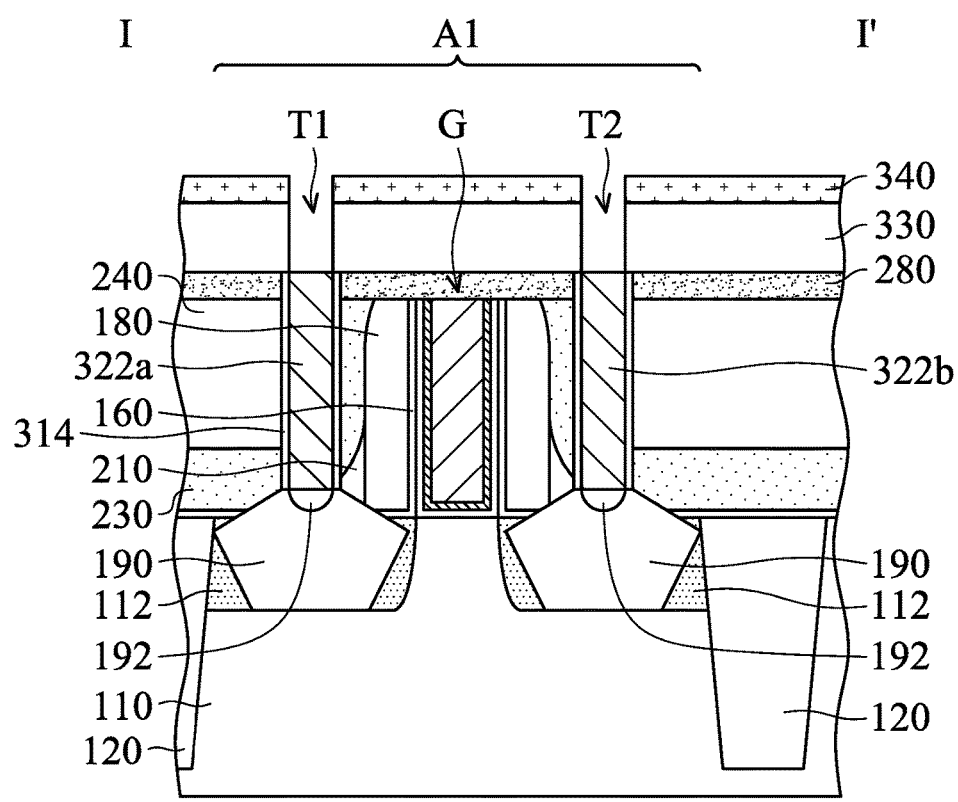
Figures 2, 2A:
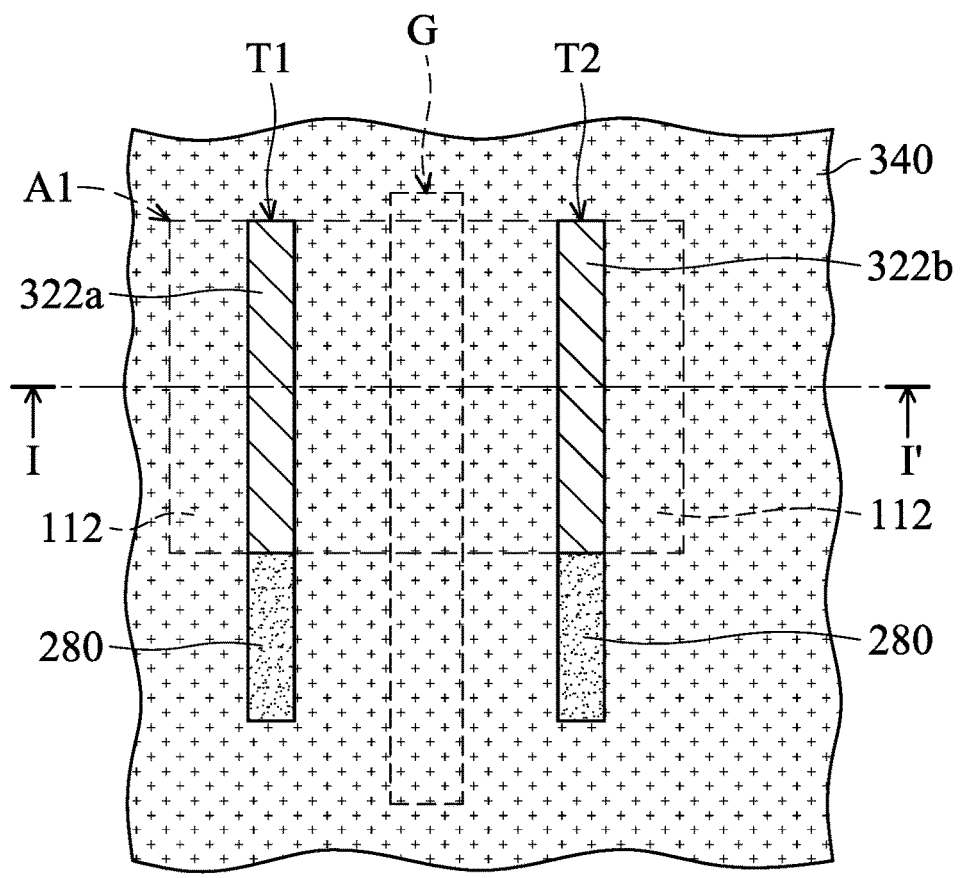
Figures 1, 2B:
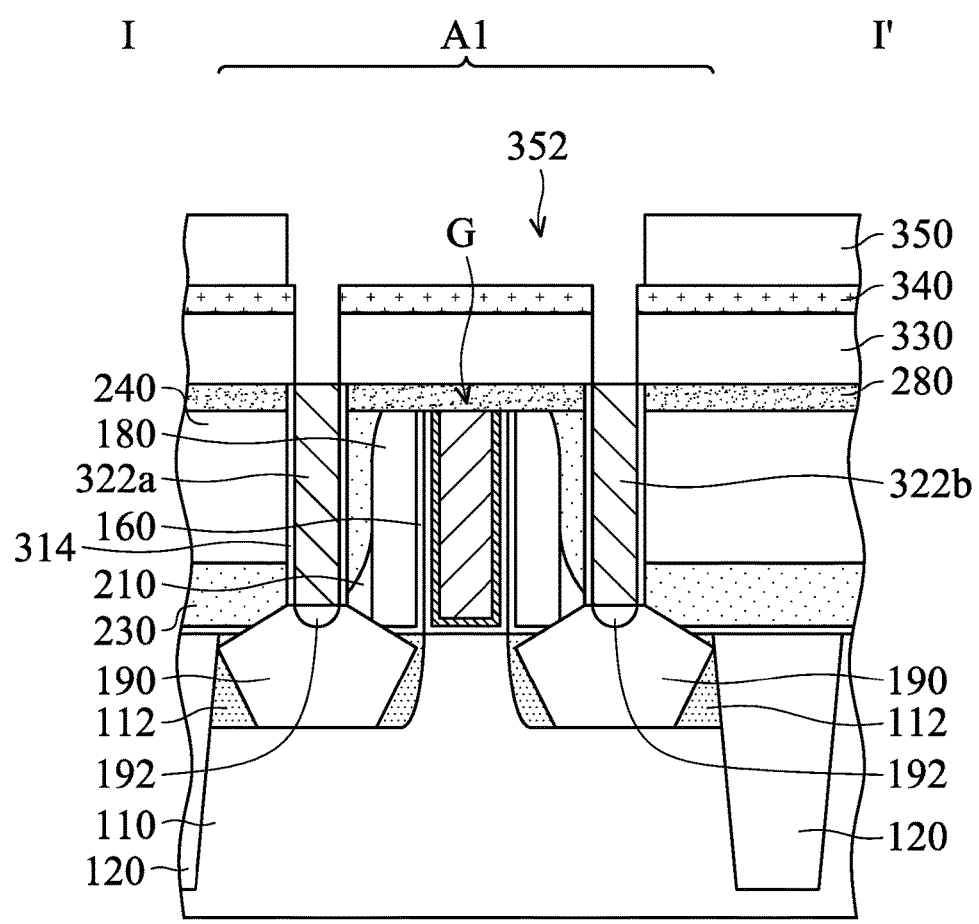
Figures 2, 2B:
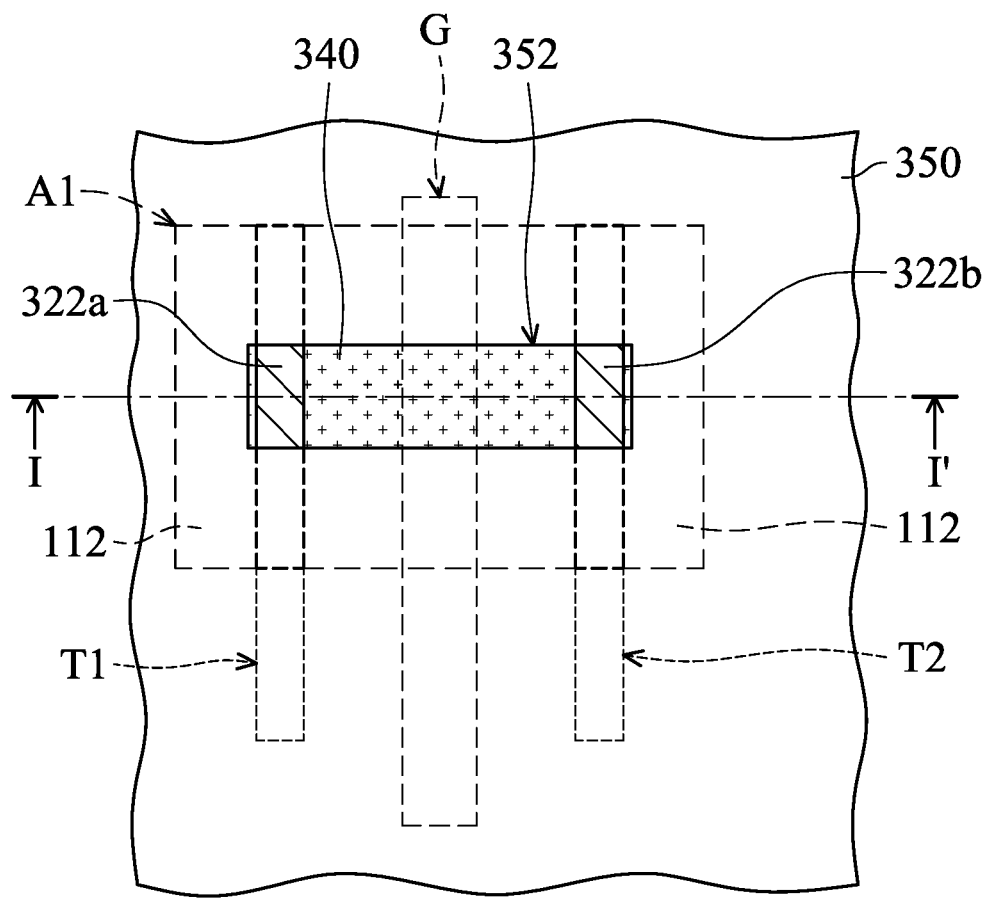
Figures 1, 2C:
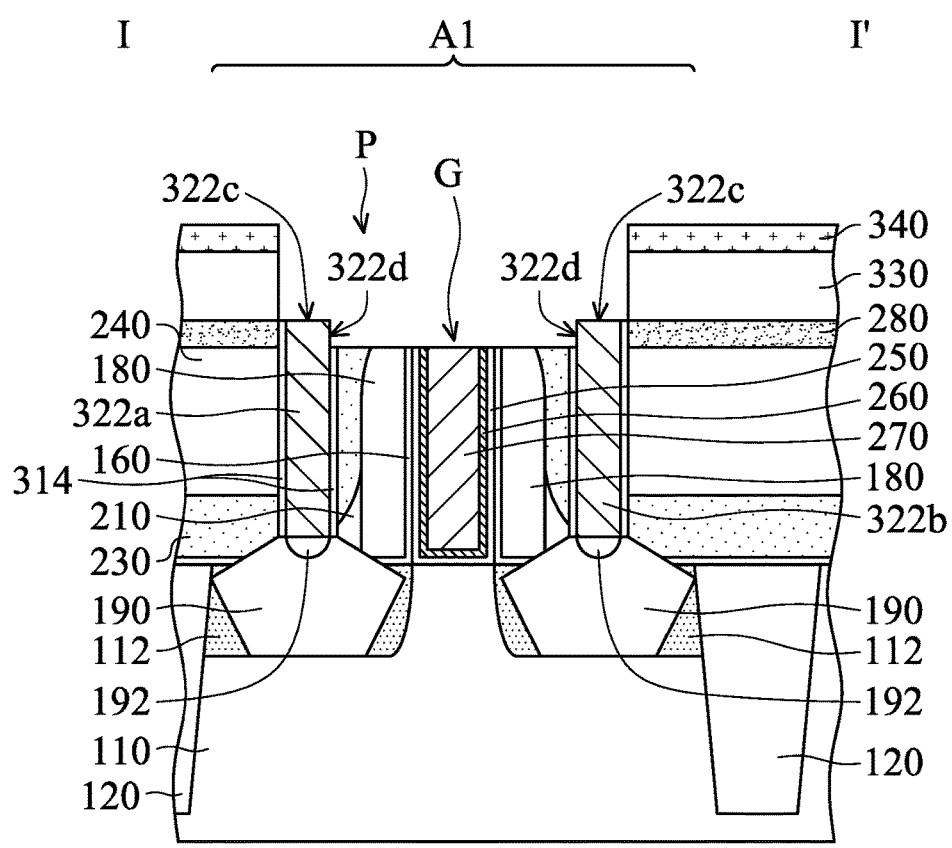
Figures 2, 2C:
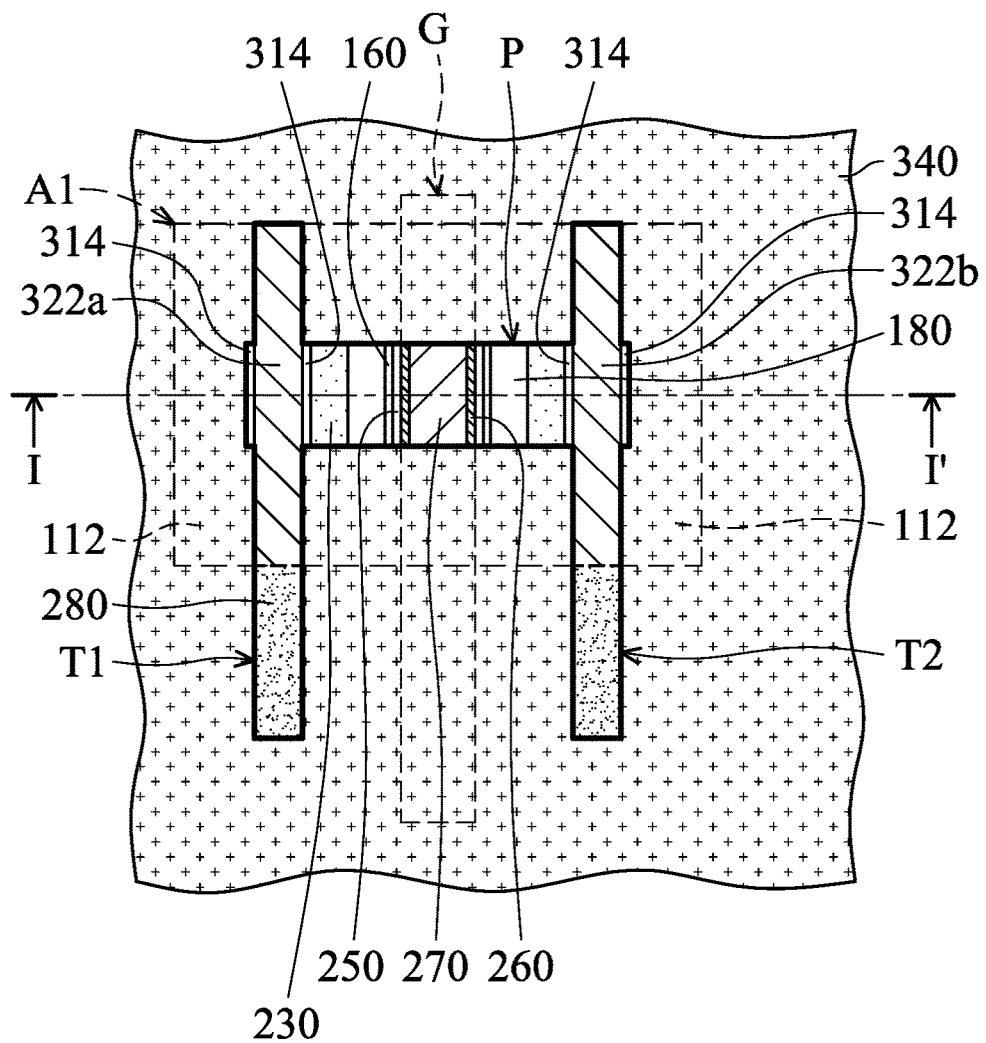
Figures 1, 2D:
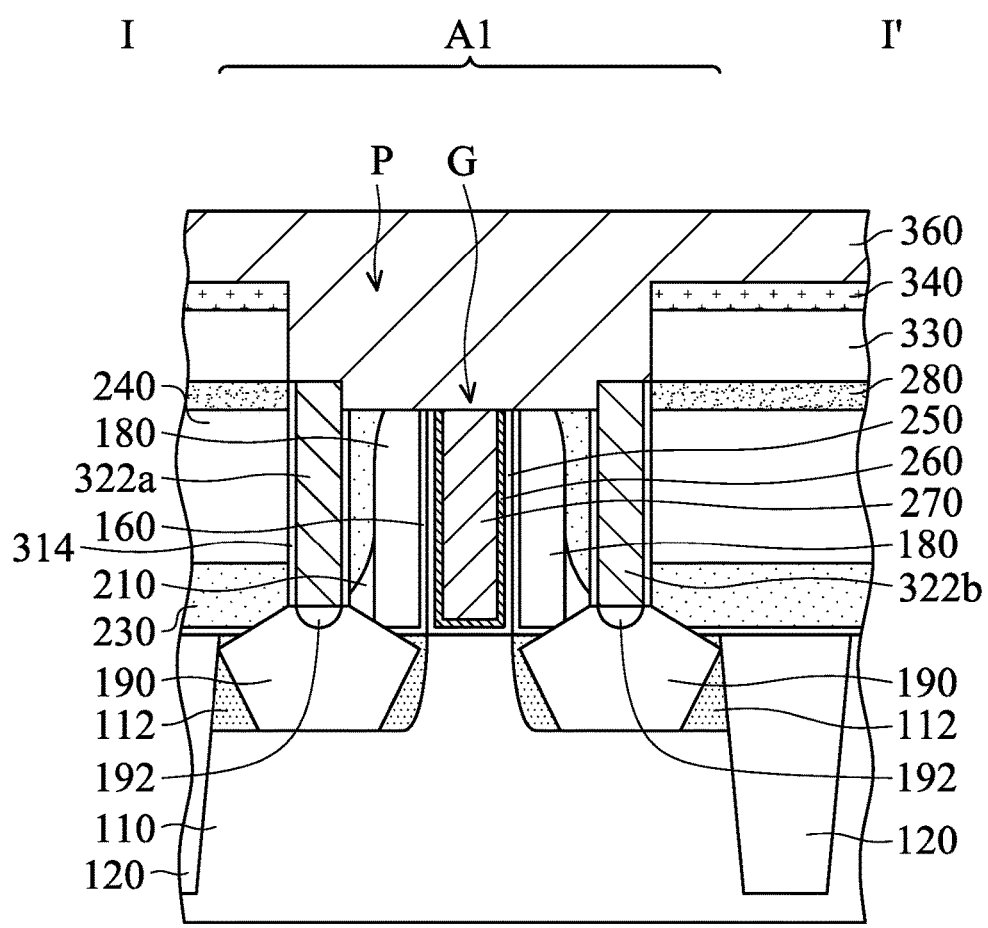
Figures 2, 2D:
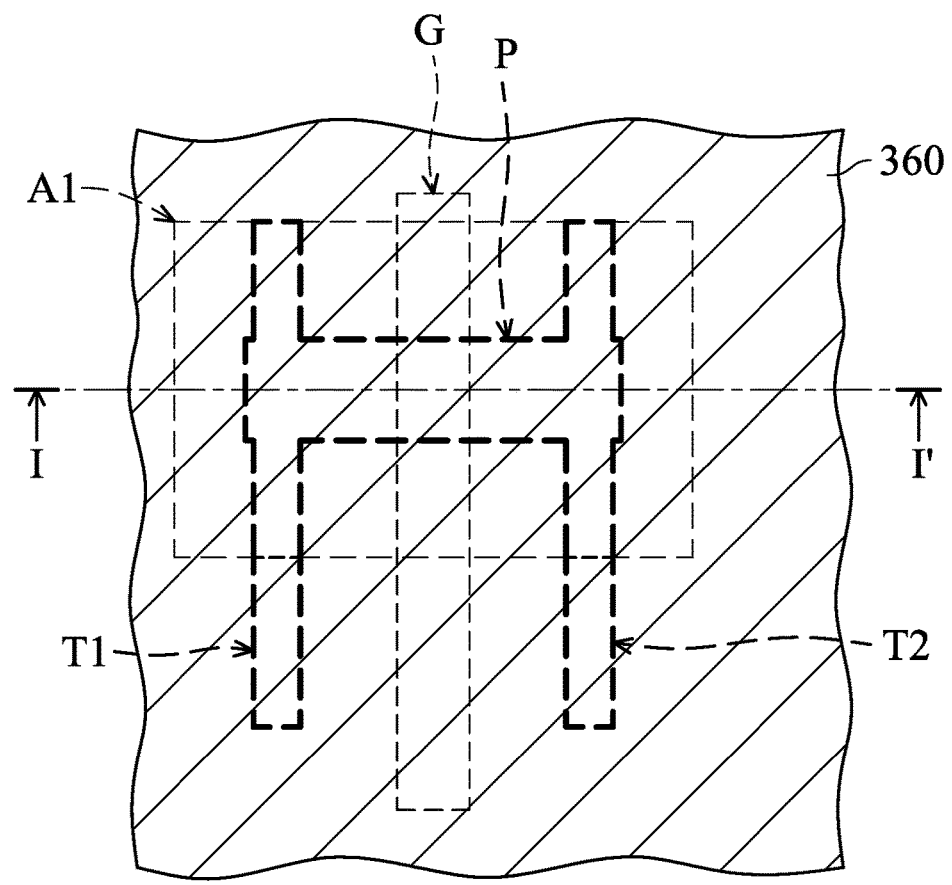
Figures 1, 2E:
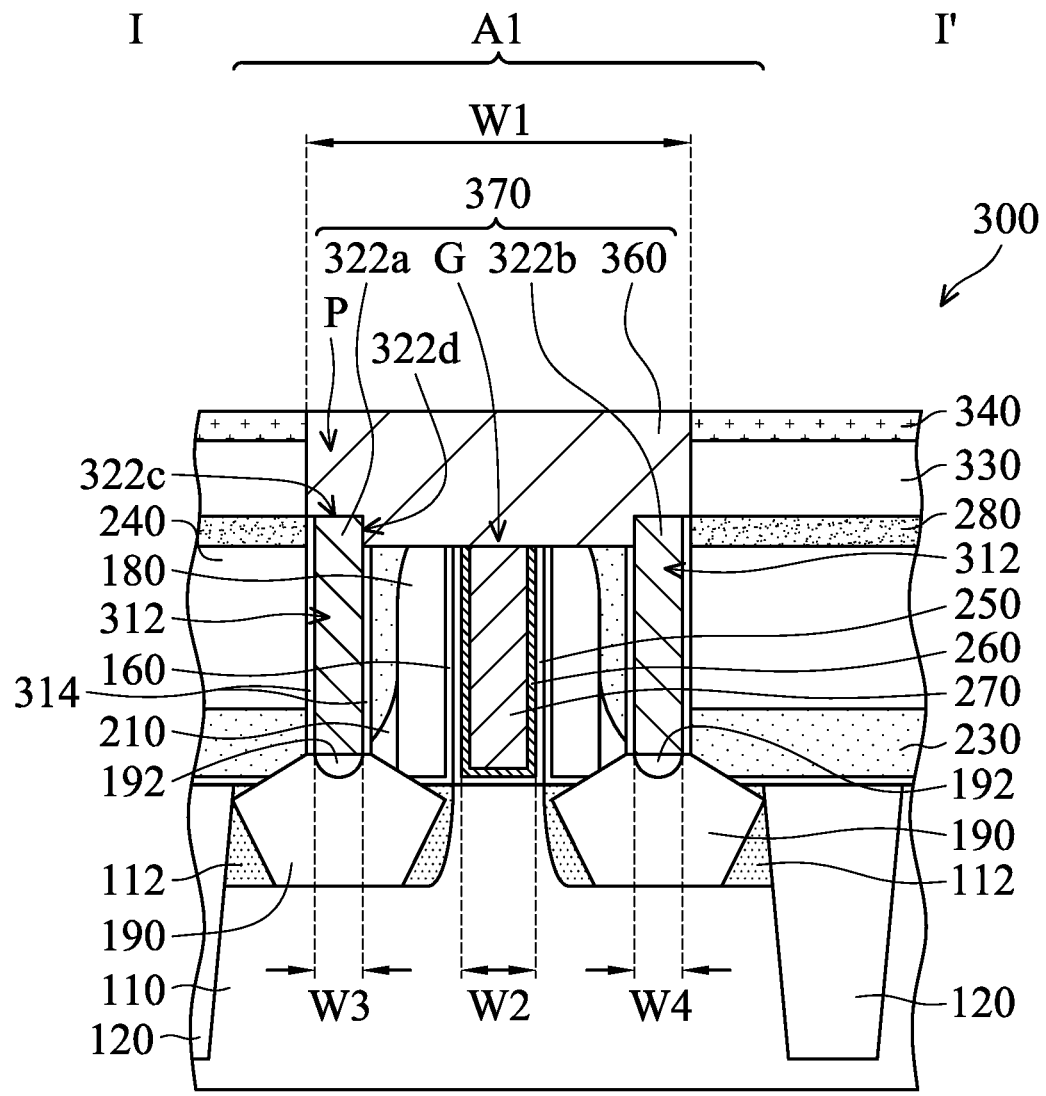
Figures 2, 2E:
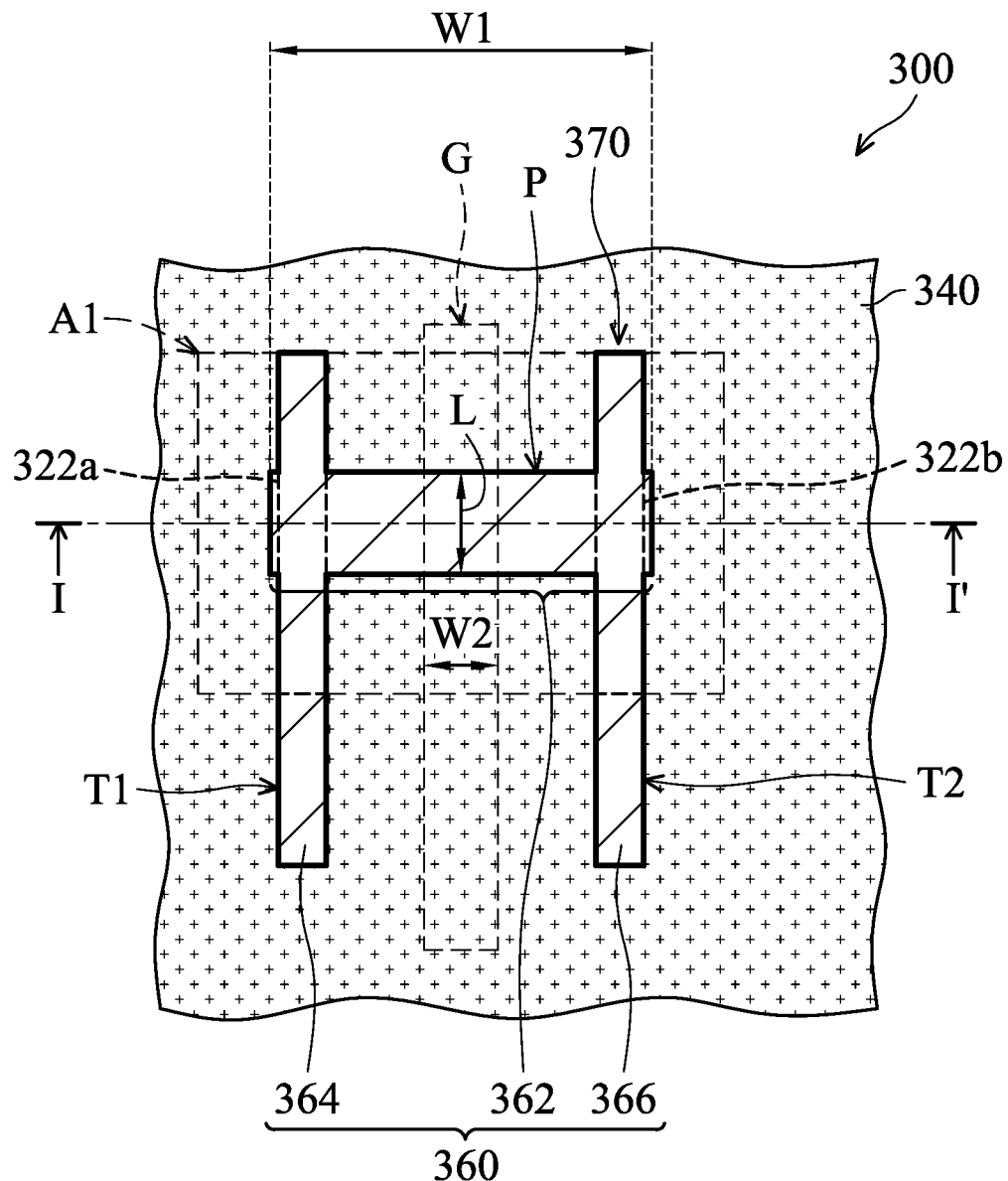

FIGS. 2A-1 to 2E-1 are cross-sectional views of various stages of a process for forming a semiconductor device structure, in accordance with some embodiments. FIGS. 2A-2 to 2E-2 are top views of various stages of the process for forming a semiconductor device structure, in accordance with some embodiments. FIGS. 2A-1 to 2E-1 are cross-sectional views of various stages of the process for forming the semiconductor device structure along lines I-I' shown in FIGS. 2A-2 to 2E-2, in accordance with some embodiments.

As shown in FIGS. 2A-1 and 2A-2, after the step of FIG. 1O, portions of the dielectric layer 330 and the etch stop layer 340 are removed to form trenches T1 and T2, in accordance with some embodiments. The trenches T1 and T2 both pass through the dielectric layer 330 and the etch stop layer 340, in accordance with some embodiments. The trenches T1 and T2 expose the contact structures 322a and 322b, respectively, in accordance with some embodiments. The trench T1 or T2 exposes a portion of the etch stop layer 280, in accordance with some embodiments. The removal process includes a dry etching process, in accordance with some embodiments. The dry etching process includes a plasma etching process, in accordance with some embodiments.

As shown in FIGS. 2B-1 and 2B-2, a mask layer 350 is formed over the etch stop layer 340, in accordance with some embodiments. The mask layer 350 has an opening 352 exposing portions of the etch stop layer 340 and the contact structures 322a and 322b, in accordance with some embodiments. The mask layer 350 includes a photoresist material, in accordance with some embodiments. The mask layer 350 is formed using a coating process and a photolithography process, in accordance with some embodiments.

As shown in FIGS. 2B-1, 2B-2, 2C-1 and 2C-2, the portions of the etch stop layer 340, the dielectric layer 330, the etch stop layer 280, the DSL layer 314 under the opening 352 are removed through the opening 352, in accordance with some embodiments. After the removal process, an opening P is formed in the etch stop layer 340, the dielectric layer 330, and the etch stop layer 280, in accordance with some embodiments. The opening P passes through the etch stop layer 340, the dielectric layer 330, and the etch stop layer 280, in accordance with some embodiments.

The opening P exposes portions of the gate G, the gate dielectric layer 250, the protective layer 160, the spacers 180, the contact etch stop layer 230, the contact structures 322a and 322b, and the DSL layer 314, in accordance with some embodiments. The opening P exposes top surfaces 322c and sidewalls 322d of the contact structures 322a and 322b, in accordance with some embodiments. The opening P connects the trenches T1 and T2, in accordance with some embodiments. The removal process includes a dry etching process, in accordance with some embodiments. The dry etching process includes a plasma etching process, in accordance with some embodiments. Thereafter, the mask layer 350 is removed, in accordance with some embodiments.

As shown in FIGS. 2D-1 and 2D-2, a conductive layer 360 is formed over the etch stop layer 340 to fill the opening P, in accordance with some embodiments. The conductive layer 360 is in direct contact with the gate G, the gate dielectric layer 250, the protective layer 160, the spacers 180, the contact etch stop layer 230, the contact structures 322a and 322b, and the DSL layer 314, in accordance with some embodiments. The conductive layer 360 includes tungsten or another suitable conductive material. The conductive layer 360 is formed using a PVD process or another suitable process.

As shown in FIGS. 2E-1 and 2E-2, the conductive layer 360 outside of the opening P and the trenches T1 and T2 is removed, in accordance with some embodiments. The removal process includes a planarization process, in accordance with some embodiments. The planarization process includes a chemical mechanical polishing process, in accordance with some embodiments. In this step, a semiconductor device structure 300 is substantially formed, in accordance with some embodiments.

The conductive layer 360 has a connection portion 362 and conductive lines 364 and 366, in accordance with some embodiments. The connection portion 362 is positioned in the opening P and is connected to the conductive lines 364 and 366, in accordance with some embodiments.

The connection portion 362 is connected to the gate G and the contact structures 322a and 322b, in accordance with some embodiments. The connection portion 362 (or the conductive layer 360) extends across the gate G and the contact structures 322a and 322b, in accordance with some embodiments. The connection portion 362 (or the conductive layer 360) over the gate G is over the active region Al, in accordance with some embodiments.

In some embodiments, a portion of the connection portion 362 or the whole connection portion 362 is located between the conductive lines 364 and 366, in accordance with some embodiments. The conductive lines 364 and 366 are located in the trenches T1 and T2, respectively, in accordance with some embodiments. The conductive lines 364 and 366 overlap the contact structures 322a and 322b, respectively, in accordance with some embodiments. In some embodiments, the conductive layer 360 has an H-like shape. In some other embodiments, the conductive lines 364 and 366 are not formed.

In some embodiments, the conductive layer 360 (or the connection portion 362) has a width W1. In some embodiments, the gate G has a width W2. In some embodiments, the contact structure 322a has a width W3, and the contact structure 322b has a width W4. In some embodiments, the width W1 is greater than a sum of the widths W2, W3, and W4. In some embodiments, the conductive layer 360 over the gate G has a length L greater than the width W2 of the gate G.

The conductive layer 360 in the opening P electrically connects the gate G to the contact structures 322a and 322b, in accordance with some embodiments. Therefore, the gate G is electrically connected to the heavily doped regions 112 (i.e. the source region and the drain region) through the conductive layer 360 and the contact structures 322a and 322b.

In some embodiments, the formation of the contact openings 312, the trenches T1 and T2, and/or the opening P includes plasma etching processes. The plasma etching processes may result in electrostatic charging of the semiconductor device structure 300. The conductive layer 360 is able to conduct the static charges from the gate G (and the dielectric layers adjacent to the gate G or the conductive layer 360) to the contact structures 322a and 322b and the heavily doped regions 112 and to ground via the semiconductor substrate 110, which is grounded. Therefore, the conductive layer 360 may effectively reduce the electrostatic charging of the semiconductor device structure 300.

In some embodiments, since portions of the DSL layer 314 is removed during the formation of the opening P, portions of the sidewalls 322d of the contact structures 322a and 322b is exposed by the opening P. Therefore, the conductive layer 360 (or the connection portion 362) is not only in direct contact with the top surfaces 322c of the contact structures 322a and 322b, but also in direct contact with the sidewalls 322d of the contact structures 322a and 322b, in accordance with some embodiments. As a result, the electrical contact area between the conductive layer 360 and the contact structures 322a and 322b is enlarged, which reduces the electrical resistance between the conductive layer 360 and the contact structures 322a and 322b.

In some embodiments, a grounding structure 370 includes the conductive layer 360, the gate G, and the contact structures 322a and 322b, in accordance with some embodiments. In some embodiments, the grounding structure 370 further includes the heavily doped regions 112, the stressors 190, the metal silicide regions 192, the DSL layer 314, the spacers 180, the spacer oxide layers 210, the protective layer 160, and/or the gate dielectric layer 250, in accordance with some embodiments.

Figure 3A:
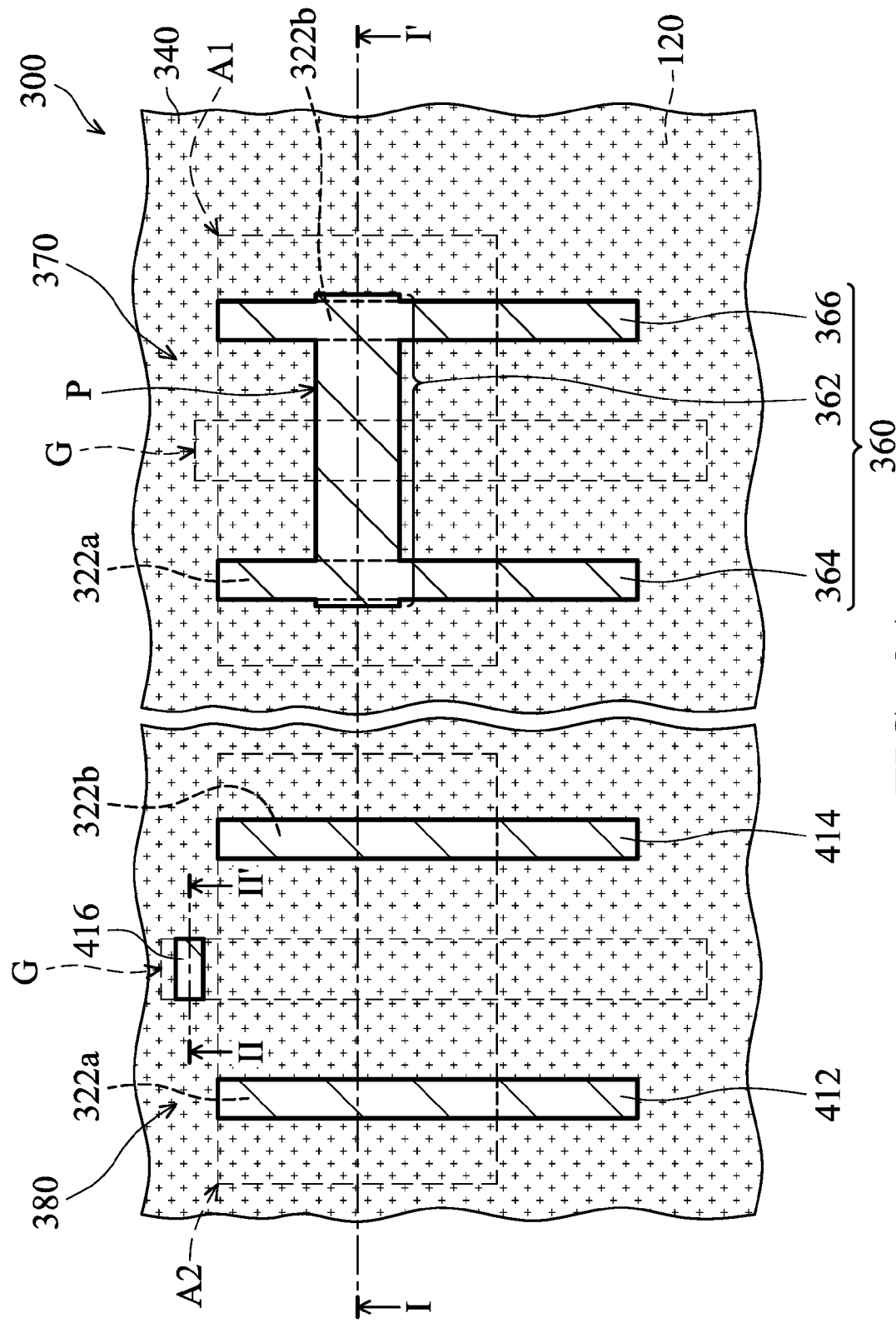
FIG. 3A is a top view of the semiconductor device structure of FIGS. 2E-1 and 2E-2, in accordance with some embodiments.
Figure 3B:
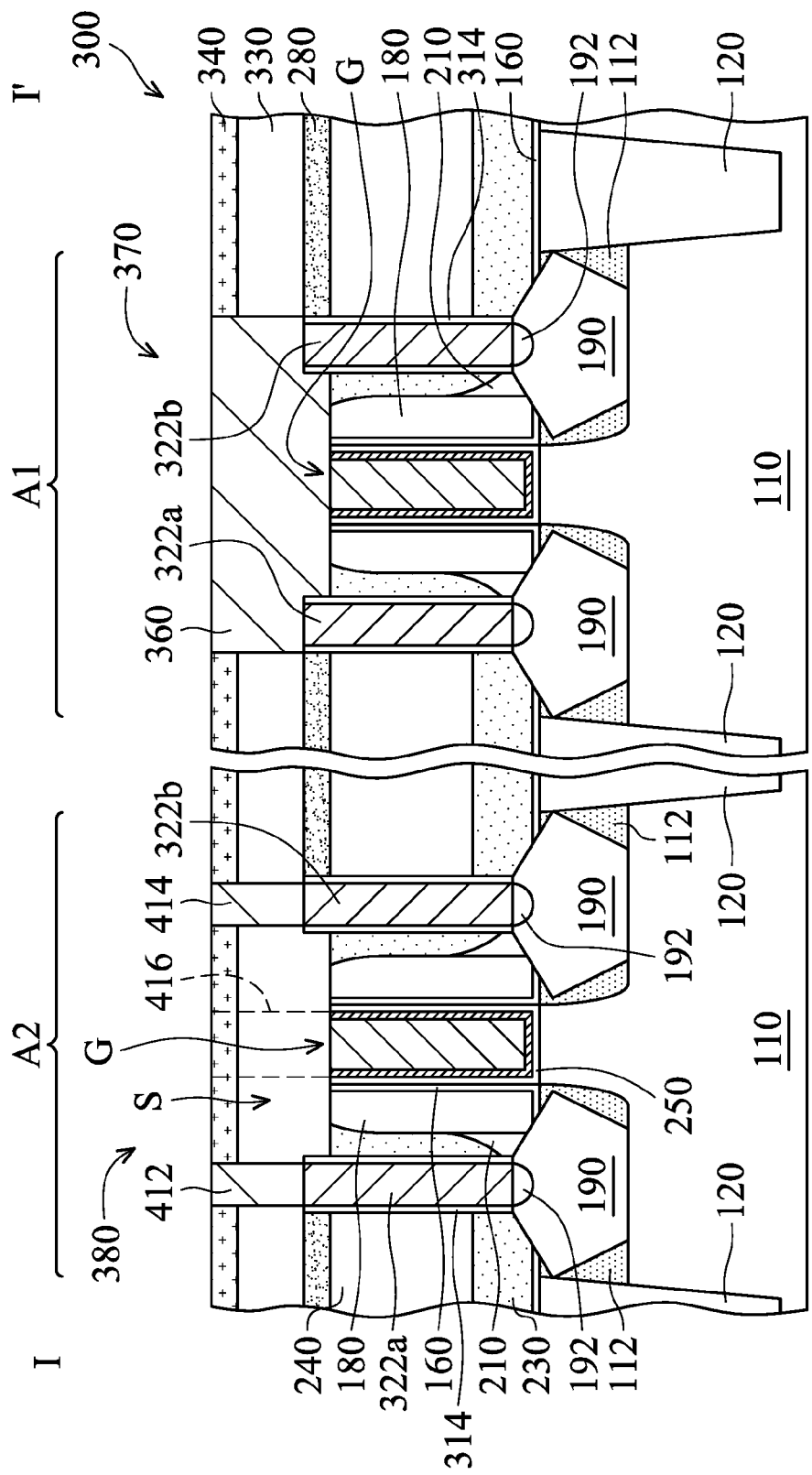
FIG. 3B is a cross-sectional view illustrating the semiconductor device structure along a sectional line I-I' in FIG. 3A, in accordance with some embodiments.
Figure 3C:
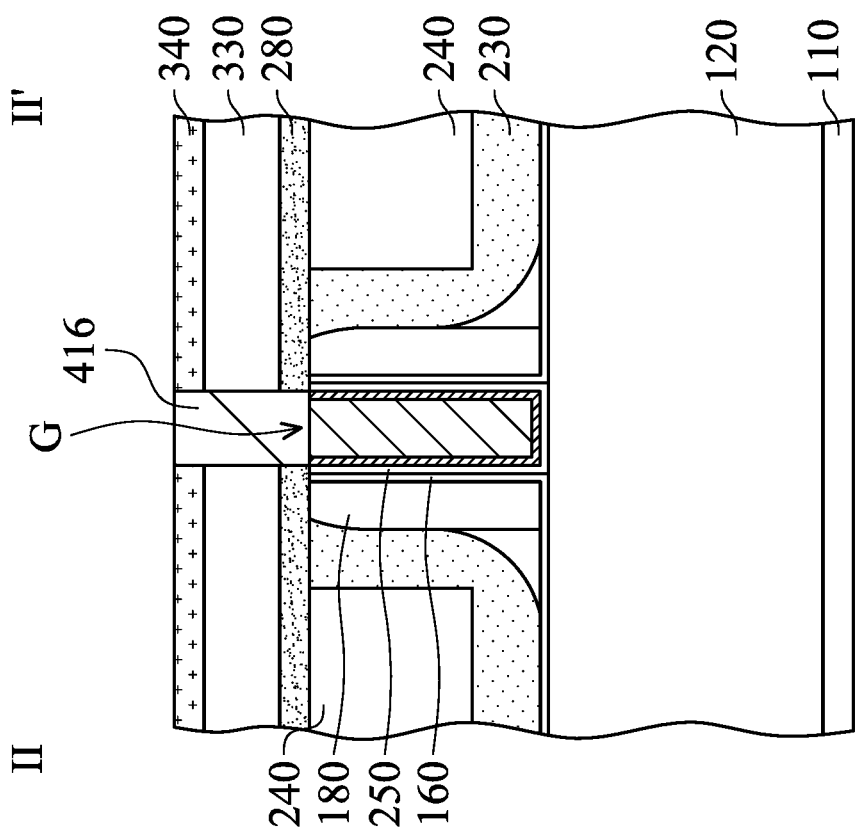
FIG. 3C is a cross-sectional view illustrating the semiconductor device structure along a sectional line II-II' in FIG. 3A, in accordance with some embodiments.

FIG. 3A is a top view of the semiconductor device structure 300 of FIG. 2E-1, in accordance with some embodiments. FIG. 3B is a cross-sectional view illustrating the semiconductor device structure 300 along a sectional line I-I' in FIG. 3A, in accordance with some embodiments. FIG. 3C is a cross-sectional view illustrating the semiconductor device structure 300 along a sectional line II-II' in FIG. 3A, in accordance with some embodiments.

As shown in FIGS. 3A-3C, the semiconductor device structure 300 further includes transistors 380 formed over active regions A2 of the semiconductor substrate 110, in accordance with some embodiments. The isolation structure 120 surrounds the active regions A2, in accordance with some embodiments. It should be noted that, for the sake of simplicity, FIGS. 3A-3C only show one of the transistors 380 and one of the active regions A2, in accordance with some embodiments.

Each of the transistors 380 includes a gate G, contact structures 322a and 322b, heavily doped regions 112, and a gate dielectric layer 250, which are similar to that of the grounding structure 370, in accordance with some embodiments. In some embodiments, each of the transistors 380 further includes stressors 190, metal silicide regions 192, a DSL layer 314, spacers 180, spacer oxide layers 210, a protective layer 160, which are similar to that of the grounding structure 370. The elements of the transistors 380 and the grounding structure 370 with the same reference number may be formed in the same step.

The transistor 380 includes conductive lines 412 and 414, and a conductive structure 416, in accordance with some embodiments. The conductive lines 412 and 414 pass through the dielectric layer 330 and the etch stop layer 340, in accordance with some embodiments. The conductive lines 412 and 414 overlap the contact structures 322a and 322b of the transistor 380, respectively, in accordance with some embodiments. The conductive line 412 is electrically connected to the contact structure 322a, in accordance with some embodiments. The conductive line 414 is electrically connected to the contact structure 322b, in accordance with some embodiments.

The conductive structure 416 passes through the etch stop layer 280, the dielectric layer 330, and the etch stop layer 340, in accordance with some embodiments. The conductive structure 416 overlaps and is electrically connected to the gate G, in accordance with some embodiments. The whole conductive structure 416 is over the isolation structure 120, in accordance with some embodiments. Since the conductive layer 360 of the grounding structure 370 may effectively reduce the electrostatic charging of the semiconductor device structure 300, the electrical performance of the transistors 380 is improved.

The conductive layer 360 may have some variations, which are exemplarily described as follows.

Figure 4A:
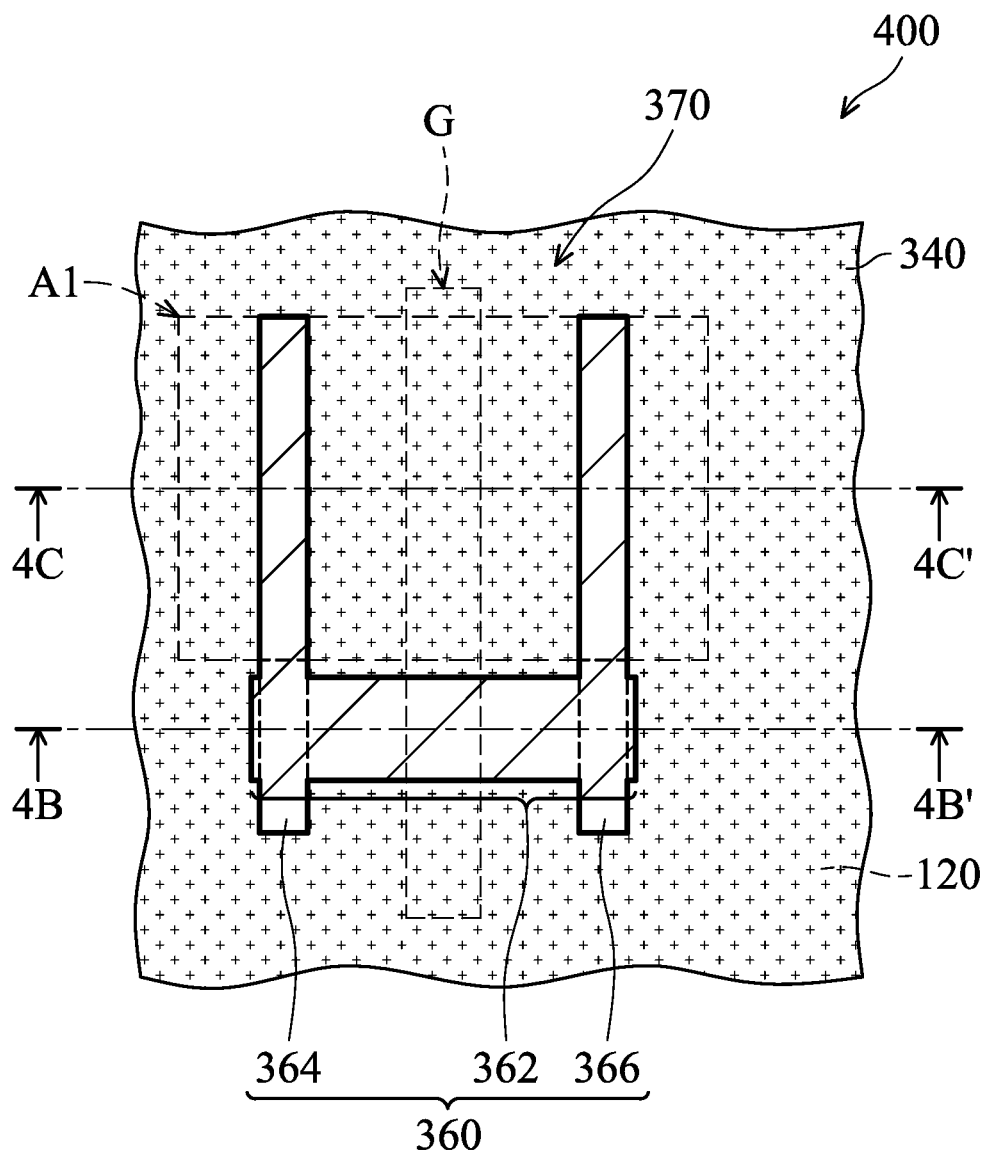
FIG. 4A is a top view of a semiconductor device structure, in accordance with some embodiments.
Figure 4B:
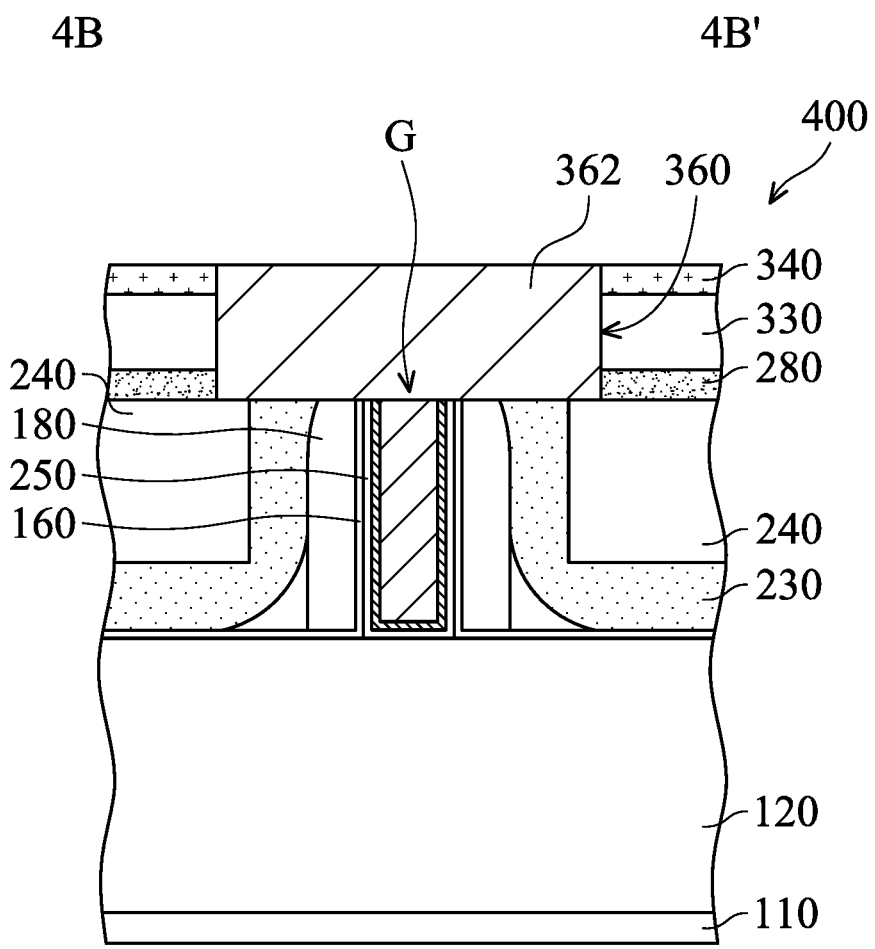
FIG. 4B is a cross-sectional view illustrating the semiconductor device structure along a sectional line 4B-4B' in FIG. 4A, in accordance with some embodiments.
Figure 4C:
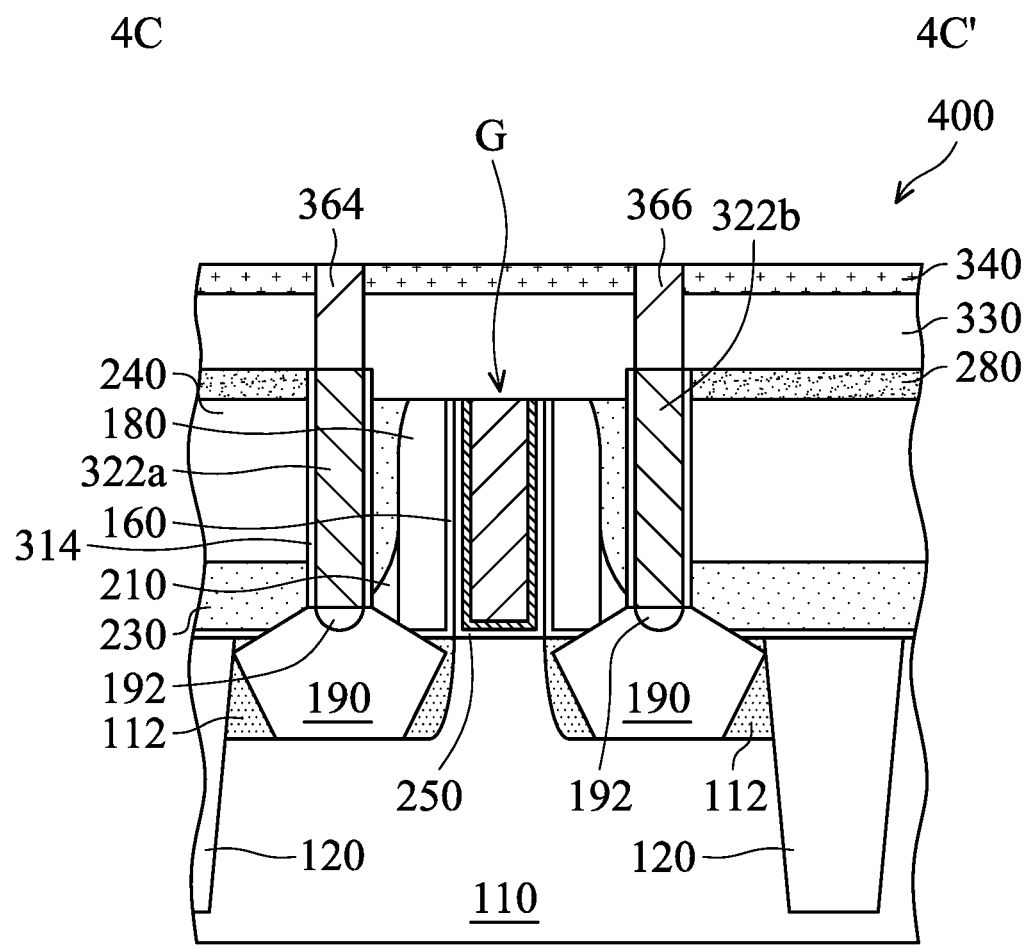
FIG. 4C is a cross-sectional view illustrating the semiconductor device structure along a sectional line 4C-4C' in FIG. 4A, in accordance with some embodiments.

FIG. 4A is a top view of a semiconductor device structure 400, in accordance with some embodiments. FIG. 4B is a cross-sectional view illustrating the semiconductor device structure 400 along a sectional line 4B-4B' in FIG. 4A, in accordance with some embodiments. FIG. 4C is a cross-sectional view illustrating the semiconductor device structure 400 along a sectional line 4C-4C' in FIG. 4A, in accordance with some embodiments.

As shown in FIGS. 4A-4C, the semiconductor device structure 400 is similar to the semiconductor device structure 300 of FIGS. 2E-1 and 2E-2, except that the connection portion 362 of the conductive layer 360 of the semiconductor device structure 400 is positioned over the isolation structure 120, in accordance with some embodiments. The whole connection portion 362 of the semiconductor device structure 400 is positioned over the isolation structure 120, in accordance with some embodiments. The connection portion 362 over the gate G is positioned over the isolation structure 120, in accordance with some embodiments.

Figure 5A:
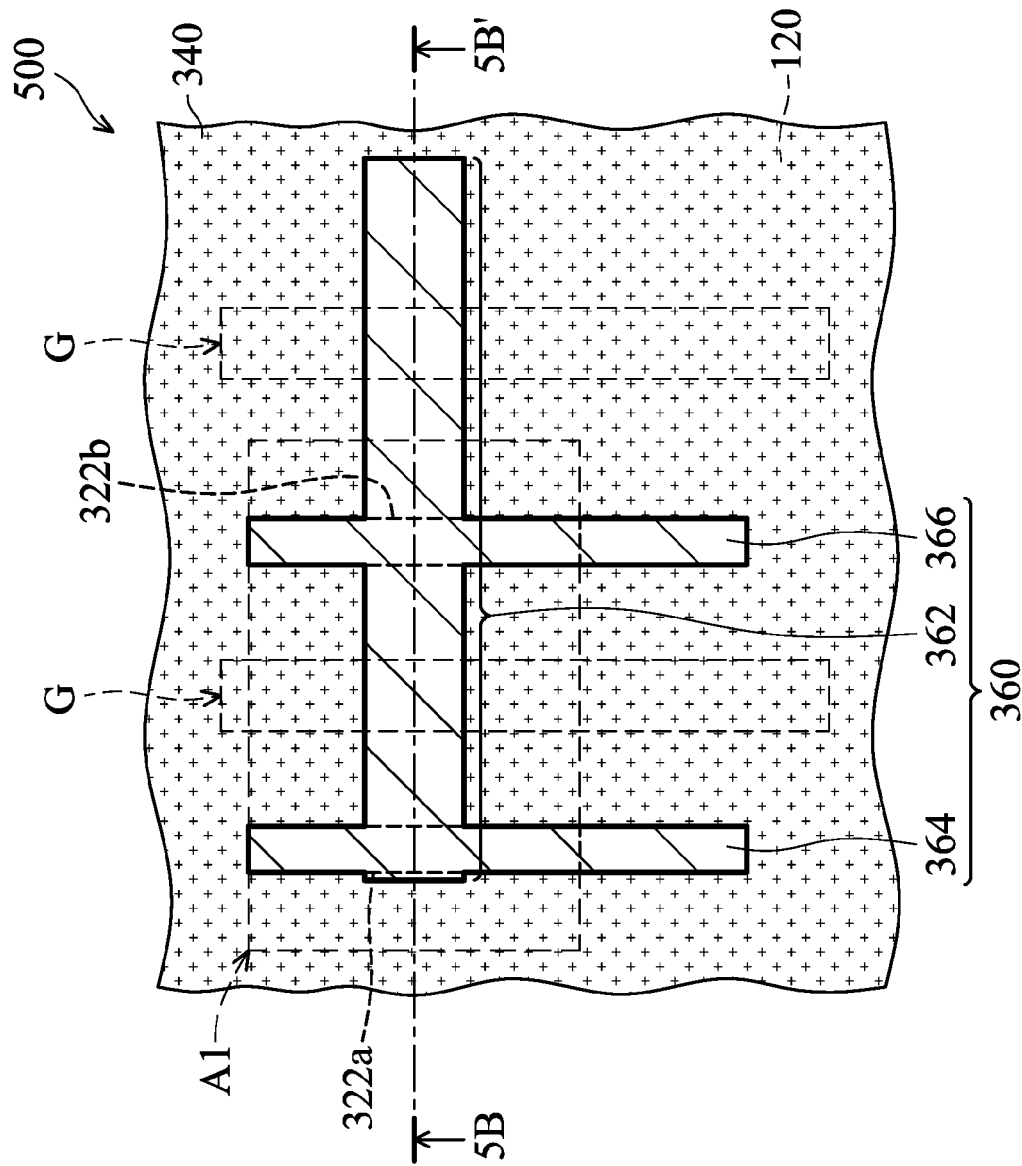
FIG. 5A is a top view of a semiconductor device structure, in accordance with some embodiments.
Figure 5B:
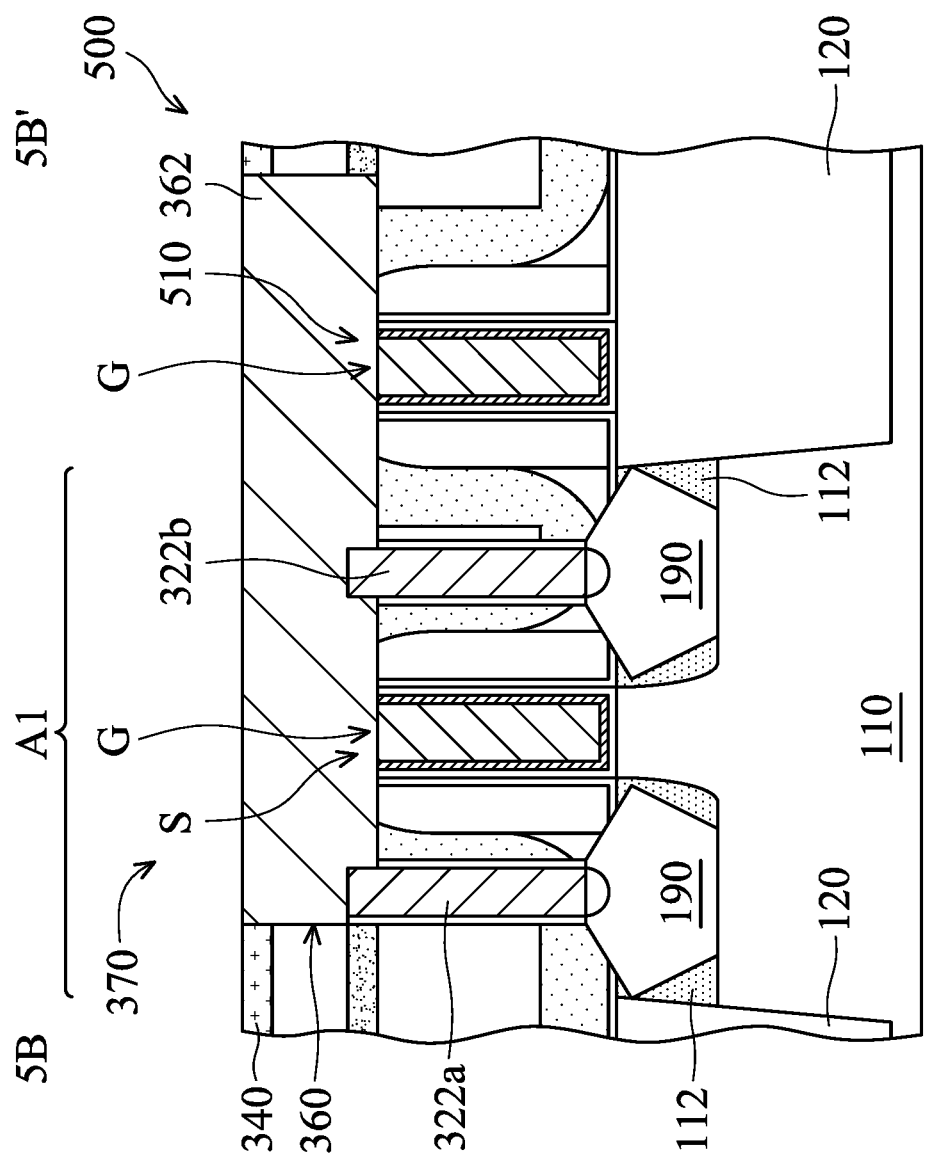
FIG. 5B is a cross-sectional view illustrating the semiconductor device structure along a sectional line 5B-5B' in FIG. 5A, in accordance with some embodiments.

FIG. 5A is a top view of a semiconductor device structure 500, in accordance with some embodiments. FIG. 5B is a cross-sectional view illustrating the semiconductor device structure 500 along a sectional line 5B-5B' in FIG. 5A, in accordance with some embodiments.

As shown in FIGS. 5A and 5B, the semiconductor device structure 500 is similar to the semiconductor device structure 300 of FIGS. 2E-1 and 2E-2, except that the conductive layer 360 of the semiconductor device structure 500 further extends onto a dummy gate stack structure 510, in accordance with some embodiments.

The dummy gate stack structure 510 is similar to the gate stack structure S of the semiconductor device structure 300 (as shown in FIG. 1J), except that the dummy gate stack structure 510 is mainly positioned over the isolation structure 120, in accordance with some embodiments. The whole gate G of the dummy gate stack structure 510 is positioned over the isolation structure 120, in accordance with some embodiments.

The conductive layer 360 extends across the contact structures 322a and 322b and the gates G of the dummy gate stack structure 510 and the gate stack structure S, in accordance with some embodiments. The conductive layer 360 is electrically connected to the contact structures 322a and 322b and the gates G of the dummy gate stack structure 510 and the gate stack structure S, in accordance with some embodiments.

The conductive layer 360 is able to conduct the static charges from the gates G of the dummy gate stack structure 510 and the gate stack structure S to the contact structures 322a and 322b and the heavily doped regions 112 and to ground via the semiconductor substrate 110, which is grounded.

The conductive layer 360 is positioned over the contact structures 322a and 322b, the gates G of the dummy gate stack structure 510 and the gate stack structure S, the active region A1, and the isolation structure 120, in accordance with some embodiments. A portion of the contact structure 322b penetrates into the connection portion 362, in accordance with some embodiments.

Figure 6A:
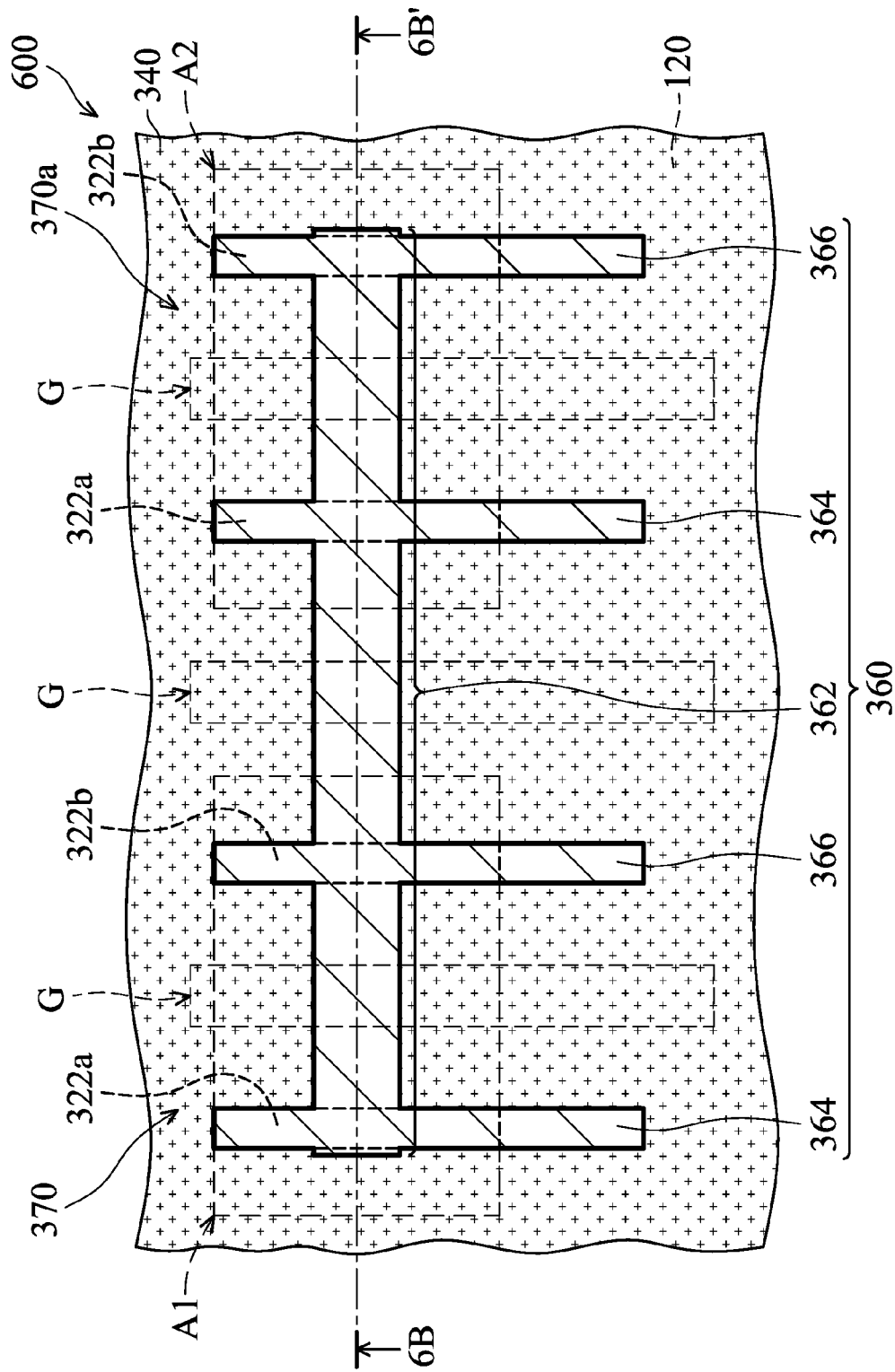
FIG. 6A is a top view of a semiconductor device structure, in accordance with some embodiments.
Figure 6B:
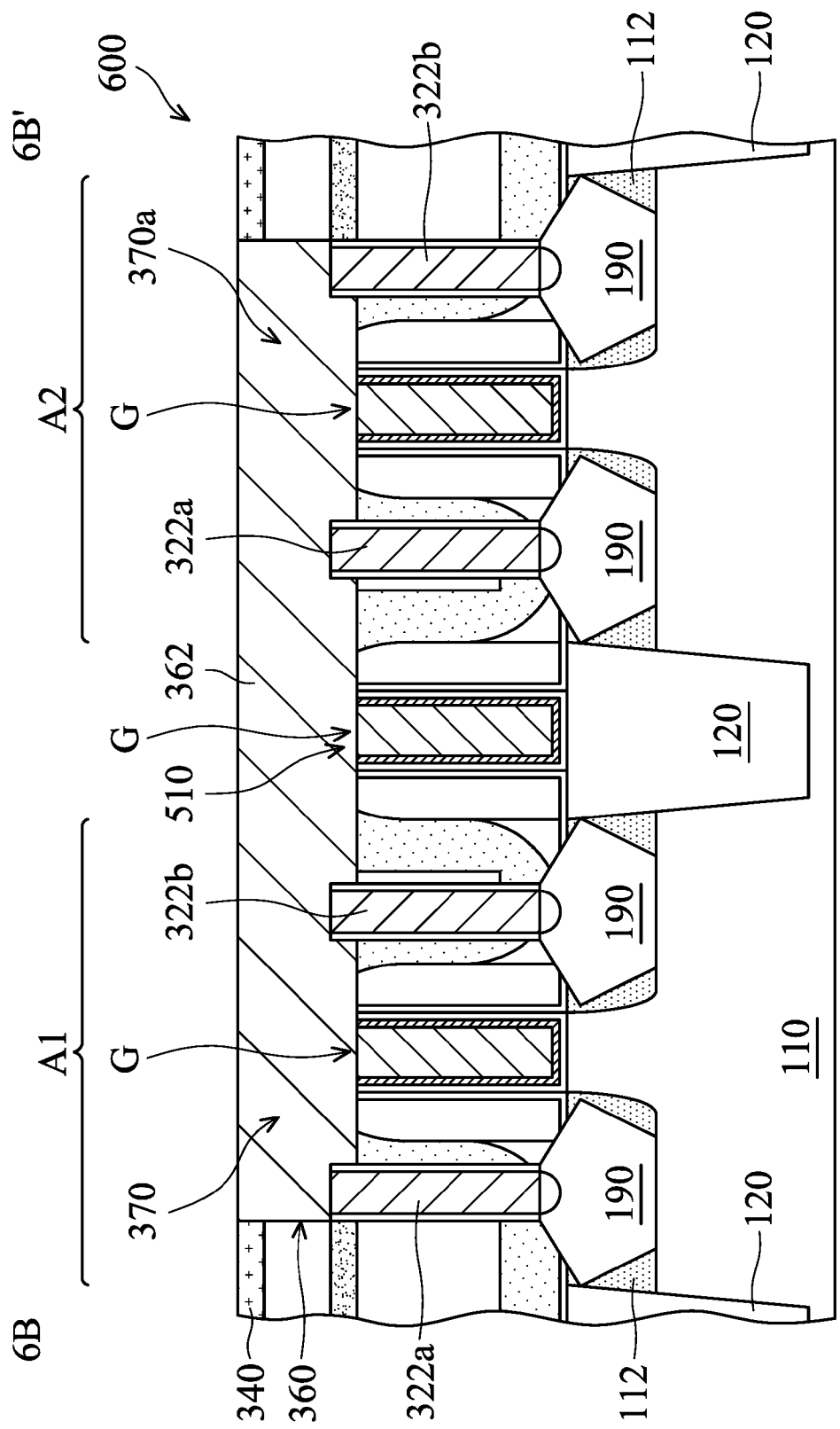
FIG. 6B is a cross-sectional view illustrating the semiconductor device structure along a sectional line 6B-6B' in FIG. 6A, in accordance with some embodiments.

FIG. 6A is a top view of a semiconductor device structure 600, in accordance with some embodiments. FIG. 6B is a cross-sectional view illustrating the semiconductor device structure 600 along a sectional line 6B-6B' in FIG. 6A, in accordance with some embodiments.

As shown in FIGS. 6A and 6B, the semiconductor device structure 600 is similar to the semiconductor device structure 500 of FIGS. 5A and 5B, except that the conductive layer 360 of the semiconductor device structure 600 further extends onto another grounding structure 370a, in accordance with some embodiments. The isolation structure 120 further surrounds an active region A2, and the grounding structure 370a is located over the active region A2.

The grounding structure 370a is similar to the grounding structure 370, and the conductive layer 360 is a common conductive layer of the grounding structure 370 and 370a, in accordance with some embodiments. The conductive layer 360 extends across the gates G and the contact structures 322a and 322b of the grounding structure 370 and 370a, in accordance with some embodiments.

The conductive layer 360 is electrically connected to the gates G and the contact structures 322a and 322b of the grounding structure 370 and 370a, in accordance with some embodiments. Portions of the contact structures 322a and 322b penetrate into the connection portion 362, in accordance with some embodiments.

The conductive layer 360 is able to conduct the static charges from the gates G of the dummy gate stack structure 510 and the grounding structure 370 and 370a to the contact structures 322a and 322b and the heavily doped regions 112 and to ground via the semiconductor substrate 110, which is grounded.

Figure 7A:
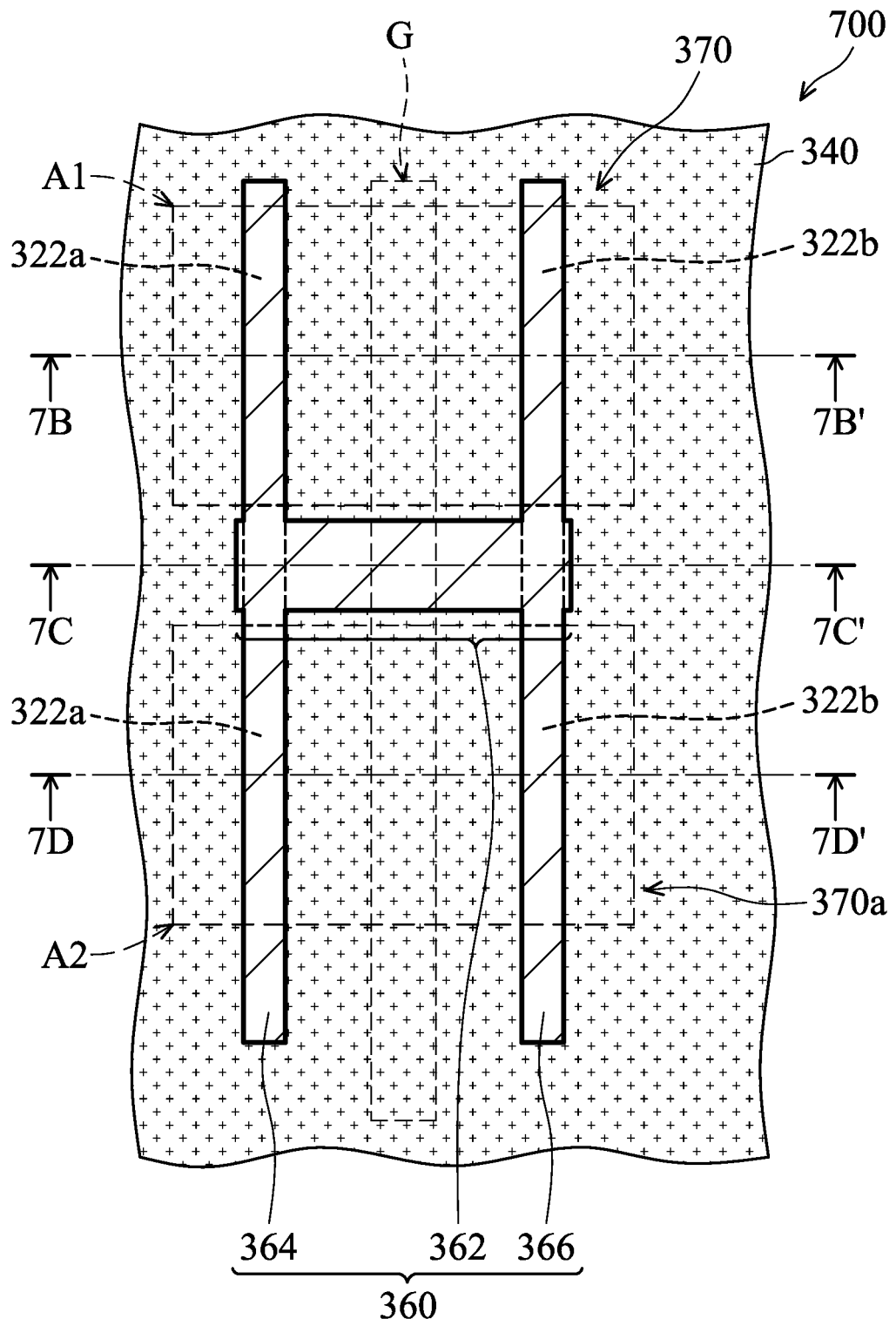
FIG. 7A is a top view of a semiconductor device structure, in accordance with some embodiments.
Figure 7B:
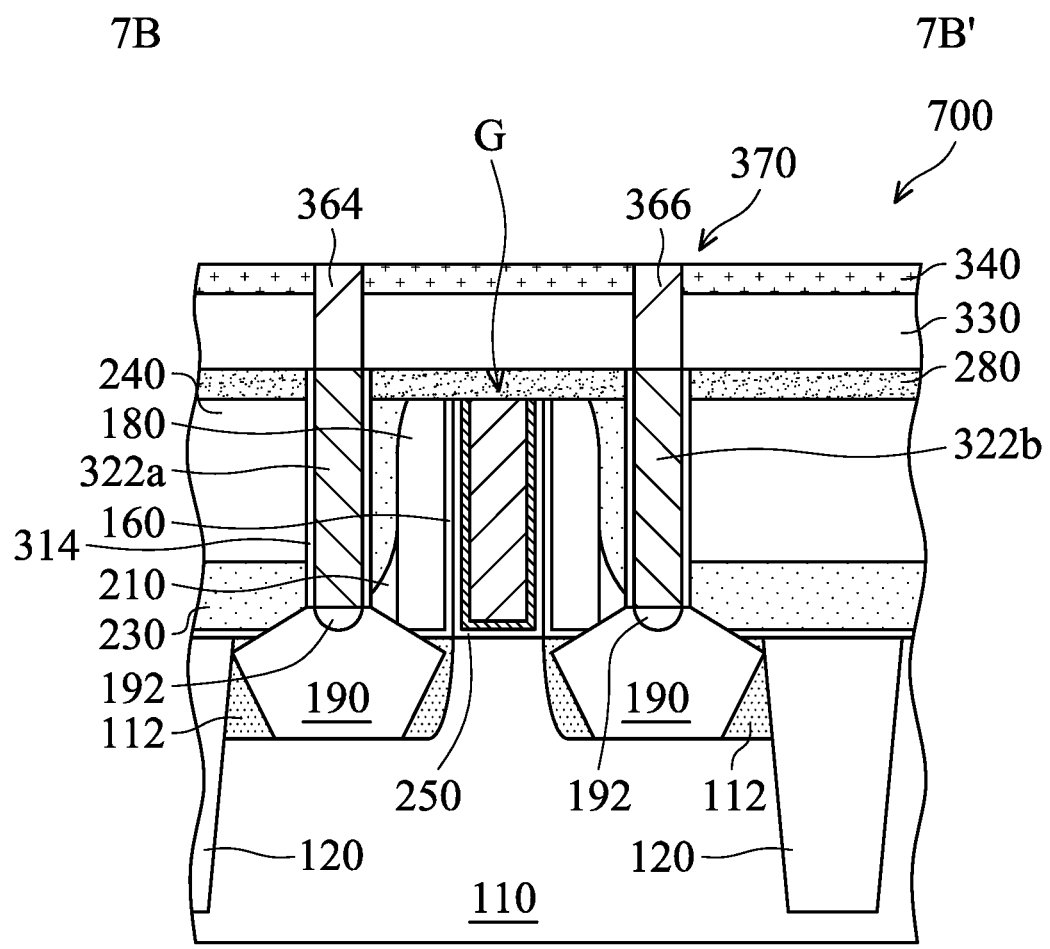
FIG. 7B is a cross-sectional view illustrating the semiconductor device structure along a sectional line 7B-7B' in FIG. 7A, in accordance with some embodiments.
Figure 7C:
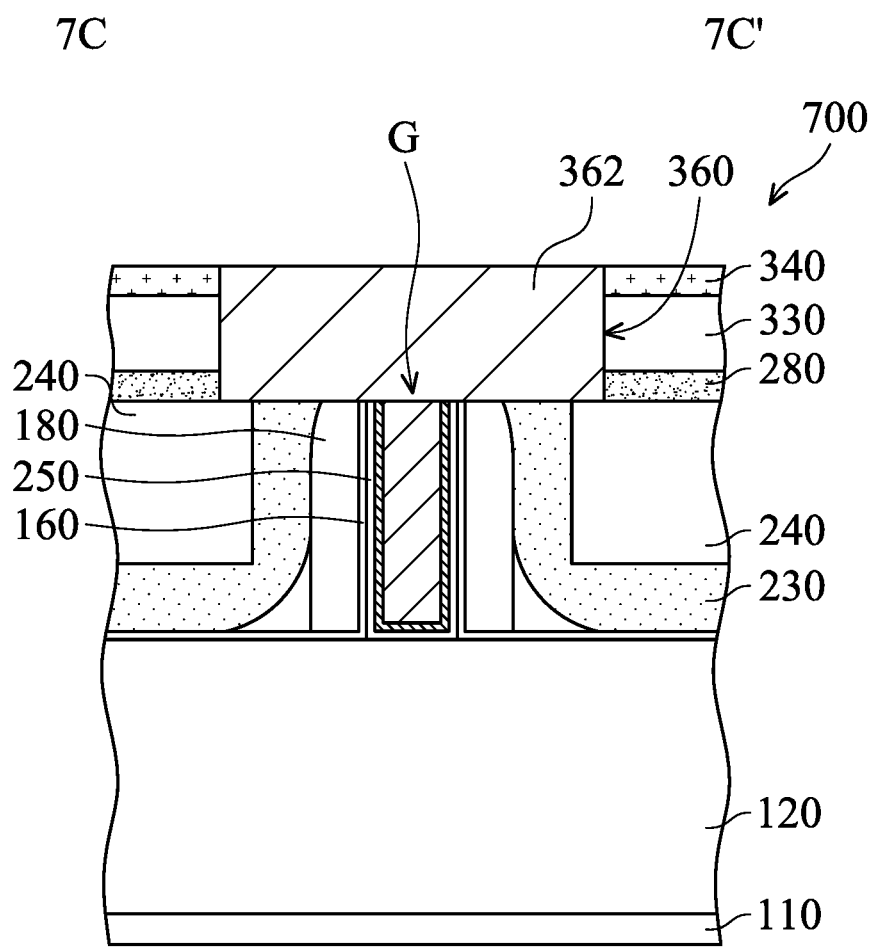
FIG. 7C is a cross-sectional view illustrating the semiconductor device structure along a sectional line 7C-7C' in FIG. 7A, in accordance with some embodiments.
Figure 7D:
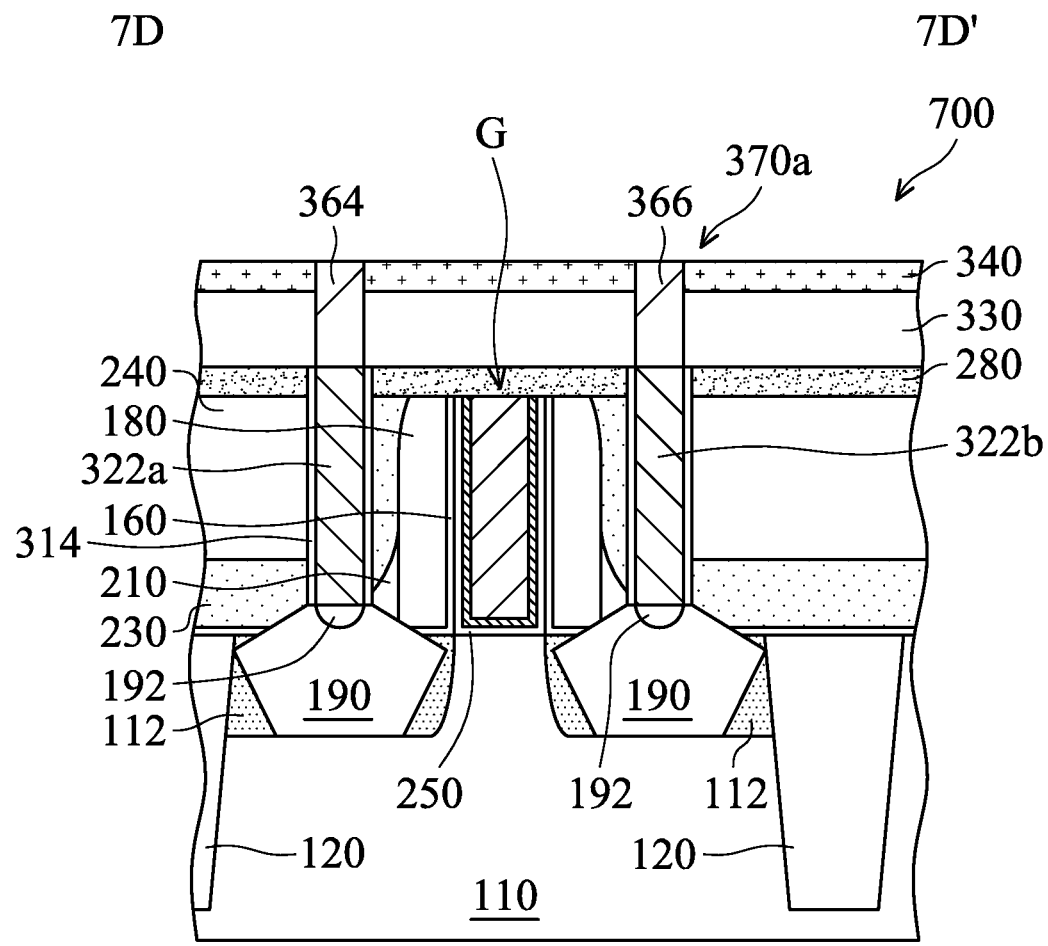
FIG. 7D is a cross-sectional view illustrating the semiconductor device structure along a sectional line 7D-7D' in FIG. 7A, in accordance with some embodiments.

FIG. 7A is a top view of a semiconductor device structure 700, in accordance with some embodiments. FIG. 7B is a cross-sectional view illustrating the semiconductor device structure 700 along a sectional line 7B-7B' in FIG. 7A, in accordance with some embodiments. FIG. 7C is a cross-sectional view illustrating the semiconductor device structure 700 along a sectional line 7C-7C' in FIG. 7A, in accordance with some embodiments. FIG. 7D is a cross-sectional view illustrating the semiconductor device structure 700 along a sectional line 7D-7D' in FIG. 7A, in accordance with some embodiments.

As shown in FIGS. 7A-7D, the semiconductor device structure 700 is similar to the semiconductor device structure 400 of FIGS. 4A and 4B, except that the conductive lines 364 and 366 further extend onto another grounding structure 370a over an active region A2 of the semiconductor substrate 110, in accordance with some embodiments. The conductive line 364 is connected to the contact structures 322a of the grounding structures 370 and 370a, in accordance with some embodiments.

The conductive line 366 is connected to the contact structures 322b of the grounding structures 370 and 370a, in accordance with some embodiments. The conductive layer 360 electrically connects the gate G to the heavily doped regions 112 of the grounding structures 370 and 370a, in accordance with some embodiments. The conductive layer 360 is a common conductive layer of the grounding structures 370 and 370a, in accordance with some embodiments.

In accordance with some embodiments, semiconductor device structures and methods for forming the same are provided. The methods (for forming the semiconductor device structure) form a conductive layer to electrically connect a gate to contact structures over a semiconductor substrate. Therefore, the conductive layer is able to conduct the static charges from the gate to ground via the contact structures and the semiconductor substrate. As a result, the conductive layer effectively reduces the electrostatic charging of the semiconductor device structure, which improves the electrical performance of the semiconductor device structure.

In accordance with some embodiments, a semiconductor device structure is provided. The semiconductor device structure includes a substrate having a first source region and a first drain region. The semiconductor device structure includes a first gate over the substrate and between the first source region and the first drain region. The semiconductor device structure includes a first contact structure over the first source region. The first contact structure is electrically connected to the first source region. The semiconductor device structure includes a second contact structure over the first drain region. The second contact structure is electrically connected to the first drain region. The semiconductor device structure includes a conductive layer electrically connecting the first gate to the first contact structure and the second contact structure.

In accordance with some embodiments, a semiconductor device structure is provided. The semiconductor device structure includes a substrate having a source region and a drain region. The semiconductor device structure includes a first gate over the substrate and between the source region and the drain region. The semiconductor device structure includes a first contact structure over the source region. The first contact structure is electrically connected to the source region. The semiconductor device structure includes a second contact structure over the drain region. The second contact structure is electrically connected to the drain region. The semiconductor device structure includes a conductive layer electrically connecting the first gate to the first contact structure and the second contact structure. The conductive layer has a first width, the gate has a second width, the first contact structure has a third width, the second contact structure has a fourth width, and the first width is greater than a sum of the second width, the third width, and the fourth width.

In accordance with some embodiments, a method for forming a semiconductor device structure is provided. The method includes forming a gate, a first dielectric layer, a first contact structure, and a second contact structure over a substrate. The substrate has a source region and a drain region at two opposite sides of the gate. The first contact structure and the second contact structure are over the source region and the drain region respectively. The first dielectric layer surrounds the gate, the first contact structure, and the second contact structure. The method includes forming a second dielectric layer over the first dielectric layer. The second dielectric layer has an opening exposing the gate, the first contact structure, and the second contact structure. The method includes forming a conductive layer in the opening to electrically connect the gate to the first contact structure and the second contact structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming a semiconductor device structure, comprising:
    forming a conductive element, spacers, a first dielectric layer, a first contact structure, and a second contact structure over a substrate, wherein the substrate has a first doped region and a second doped region at two opposite sides of the conductive element, the first contact structure and the second contact structure are over the first doped region and the second doped region respectively, the spacers are on the sidewalls of the conductive element and over the first doped region and the second doped region, and the first dielectric layer surrounds the conductive element, the spacers, the first contact structure, and the second contact structure;

forming a second dielectric layer over the first dielectric layer, wherein the second dielectric layer has an opening exposing the conductive element, the first contact structure, and the second contact structure, wherein the opening is substantially H-shaped; and forming a conductive layer in the opening to electrically connect the conductive element to the first contact structure and the second contact structure, wherein the conductive layer is in direct contact with the spacers.

2. The method for forming a semiconductor device structure as claimed in claim 1, wherein the formation of the second dielectric layer comprises:

depositing a second dielectric material layer over the first dielectric layer, the gate, the first contact structure, and the second contact structure; and removing a portion of the second dielectric material layer to form the opening.

3. The method for forming a semiconductor device structure as claimed in claim 2, wherein the removal of the portion of the second dielectric material layer comprises a dry etching process.

4. The method for forming a semiconductor device structure as claimed in claim 3, wherein the dry etching process comprises a plasma etching process.

5. The method for forming a semiconductor device structure as claimed in claim 1, further comprising:

before the formation of the second dielectric layer, forming an etch stop layer over the conductive element and the first dielectric layer, and the formation of the second dielectric layer comprises:

depositing a second dielectric material layer over the etch stop layer, the first contact structure, and the second contact structure; and removing a portion of the second dielectric material layer and the etch stop layer under the portion to form the opening.

6. The method for forming a semiconductor device structure as claimed in claim 1, wherein the opening has a first portion that is substantially H-shaped and includes an extension portion extending from the first portion.

7. The method for forming a semiconductor device structure as claimed in claim 1, further comprising:

forming the opening in the second dielectric layer by:

etching a first trench and a second trench in the second dielectric layer, wherein the first trench is over the first contact structure and the second trench is over the second contact structure;

after etching the first and second trenches, forming a masking element over the second dielectric layer; and etching a portion of the second dielectric layer exposed by the masking element between the first and second trenches, wherein the first trench, second trench and the etched portion define the opening.

8. A method for forming a semiconductor device structure, comprising:

forming a gate structure over a substrate;

growing a first epitaxial region and a second epitaxial region, wherein the gate structure interposes the first and second epitaxial region;

forming a first contact opening exposing the first epitaxial region and forming a second contact opening exposing the second epitaxial region;

depositing a conductive layer in the first and second contact openings to form a first and second contact structure respectively; and forming at least one dielectric layer over the first and second contact structures;

forming an opening in the at least one dielectric layer, wherein the opening includes a contiguous opening portion that exposes a top surface of the first and second contact structures and a top surface of the gate structure; and filling the opening including the contiguous opening portion with a conductive layer.

9. The method of claim 8, wherein the conductive layer forms an H-like shape.

10. The method of claim 8, further comprising:

forming another gate structure;

wherein the forming the opening in the at least one dielectric layer includes exposing a top surface of the another gate structure.

11. The method of claim 10, wherein the contiguous opening portion extends from the top surface of the gate structure to the top surface of the another gate structure.

12. The method of claim 10, wherein the forming the another gate structure includes forming the another gate structure over an isolation region of the substrate.

13. The method of claim 8, further comprising:

forming spacer elements abutting the gate structure.

14. The method of claim 13, wherein the filling the opening with the conductive layer provides the conductive layer interfacing the spacer elements.

15. A method for forming a semiconductor device structure, comprising:

providing a substrate having a gate structure, a first epitaxial region and a second epitaxial region, wherein the gate structure interposes the first and second epitaxial region;

forming a first contact structure over the first epitaxial region and forming a second contact structure over the second epitaxial region;

forming an etch stop layer and an overlying dielectric layer over the gate structure, the first contact structure, and the second contact structure;

etching a first trench and a second trench in the etch stop layer and the overlying dielectric layer, wherein the first trench exposes the first contact structure and the second trench exposes the second contact structure;

after etching the first and second trenches, forming an opening in the etch stop layer and the overlying dielectric layer, wherein the opening extends from the first trench to the second trench; and filling the opening with a conductive material.

16. The method of claim 15, further comprising:

forming another gate structure on the substrate;

wherein the forming the opening includes forming a contiguous opening extending from the first trench to the second trench and over the another gate structure.

17. The method of claim 16, wherein the filling the opening with the conductive material included depositing the conductive material directly on a top surface of the gate structure and the another gate structure.

18. The method of claim 15, wherein the forming the opening includes a plasma etching process while providing a masking element on the substrate.

19. The method of claim 15, further comprising:

forming a spacer element abutting a sidewall of the gate structure, and wherein the forming the opening exposes a top of the spacer element.

20. The method of claim 15, further comprising:

generating a static charge during the forming the opening; and dissipating the static charge from the gate structure to the first and second contact structures and to the substrate.

* * * * *